US010068903B2

(12) United States Patent
Edwards et al.

(10) Patent No.: US 10,068,903 B2
(45) Date of Patent: Sep. 4, 2018

(54) METHODS AND APPARATUS FOR ARTIFICIAL EXCITON IN CMOS PROCESSES

(71) Applicant: Texas Instruments Incorporated, Dallas, TX (US)

(72) Inventors: Henry Litzmann Edwards, Garland, TX (US); Greg Charles Baldwin, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 272 days.

(21) Appl. No.: 14/713,802

(22) Filed: May 15, 2015

(65) Prior Publication Data
US 2015/0348968 A1   Dec. 3, 2015

Related U.S. Application Data

(60) Provisional application No. 62/005,537, filed on May 30, 2014.

(51) Int. Cl.
*H01L 27/092* (2006.01)
*H01L 29/08* (2006.01)
(Continued)

(52) U.S. Cl.
CPC .... *H01L 27/092* (2013.01); *H01L 21/823807* (2013.01); *H01L 21/823814* (2013.01);
(Continued)

(58) Field of Classification Search
CPC ............ H01L 21/823807; H01L 29/0847
See application file for complete search history.

(56) References Cited

U.S. PATENT DOCUMENTS

| 7,683,364 B2 | 3/2010 | Edwards et al. |
| 7,910,918 B2 | 3/2011 | Edwards et al. |

(Continued)

OTHER PUBLICATIONS

Kuznetsova, Y. Y., M. Remeika, A. A. High, A. T. Hammack, L. V. Butov, M. Hanson, and A. C. Gossard. "All-optical Excitonic Transistor." Optics Letters vol. 35, No. 10 (2010): 1587-1589.

*Primary Examiner* — Lex Malsawma
*Assistant Examiner* — Geoffrey Ida
(74) *Attorney, Agent, or Firm* — Andrew R. Ralston; Charles A. Brill; Frank D. Cimino

(57) ABSTRACT

Methods and apparatus for artificial exciton devices. An artificial exciton device includes a semiconductor substrate; at least one well region doped to a first conductivity type in a portion of the semiconductor substrate; a channel region in a central portion of the well region; a cathode region in the well region doped to a second conductivity type; an anode region in the well region doped to the first conductivity type; a first lightly doped drain region disposed between the cathode region and the channel region doped to the first conductivity type; a second lightly doped drain region disposed between the anode region and the channel region doped to the second conductivity type; and a gate structure overlying the channel region, the gate structure comprising a gate dielectric layer lying over the channel region and a gate conductor material overlying the gate dielectric. Methods are disclosed.

17 Claims, 18 Drawing Sheets

(51) Int. Cl.
*H01L 21/8238* (2006.01)
*H01L 29/10* (2006.01)
*H01L 29/423* (2006.01)
*H01L 29/775* (2006.01)
*H01L 29/76* (2006.01)
*H01L 29/739* (2006.01)
*H01L 29/78* (2006.01)
*H01L 21/265* (2006.01)
*H01L 29/66* (2006.01)
*H01L 29/12* (2006.01)
*H01L 27/15* (2006.01)

(52) U.S. Cl.
CPC ...... *H01L 29/0847* (2013.01); *H01L 29/1033* (2013.01); *H01L 29/42376* (2013.01); *H01L 29/7391* (2013.01); *H01L 29/7613* (2013.01); *H01L 29/775* (2013.01); *H01L 29/7836* (2013.01); *H01L 21/26513* (2013.01); *H01L 21/26586* (2013.01); *H01L 27/15* (2013.01); *H01L 29/1083* (2013.01); *H01L 29/122* (2013.01); *H01L 29/6659* (2013.01); *H01L 29/7833* (2013.01)

(56) References Cited

U.S. PATENT DOCUMENTS

| | | | |
|---|---|---|---|
| 8,026,507 | B2 | 9/2011 | Chatterjee et al. |
| 9,000,505 | B2 | 4/2015 | Edwards et al. |
| 2002/0182757 | A1* | 12/2002 | Conchieri ............... H01L 22/20 438/7 |
| 2002/0185682 | A1* | 12/2002 | Nandakumar ...... H01L 29/7833 257/344 |
| 2009/0101975 | A1* | 4/2009 | Holz ............... H01L 21/823418 257/347 |
| 2010/0200916 | A1* | 8/2010 | Gossner ................ H01L 29/083 257/335 |
| 2012/0098590 | A1 | 4/2012 | Edwards et al. |
| 2014/0225170 | A1* | 8/2014 | Kondo ................ H01L 29/7391 257/288 |

* cited by examiner

METHODS AND APPARATUS FOR ARTIFICIAL EXCITON IN CMOS PROCESSES

CROSS-REFERENCE TO RELATED APPLICATION

This application claims priority to U.S. Provisional Patent Application Ser. No. 62/005,537, filed May 30, 2014, titled "ARTIFICIAL," which application is hereby incorporated by reference herein in its entirety.

TECHNICAL FIELD

The present application relates to the field of integrated circuits (ICs) and more specifically to the fabrication of artificial exciton devices.

BACKGROUND

Optical emission devices (OEDs) such as light emitting diodes (LEDs) and lasers have various product uses for lighting, displays, signaling and communication. These OEDs are typically created to emit light in a single particular frequency. In some examples, electromagnetic energy is emitted by the devices. If the emission is within the visible light frequency, then the OEDs could be said to emit light in a single color. Visible light spectrum begins near 750 nm as red and ends near 400 nm as violet light. Infrared light occurs at wavelengths above red visible light, and ultraviolet occurs at wavelengths less than violet visible light. Infrared emission is useful in applications where visibility to the human visual system is not required, including optical communications.

The ability to fabricate optical emission devices within a CMOS IC process is highly desirable as it is well known that integration is a key aspect in both size reduction and cost reduction of electrical systems and products. By fabricating the optical emission devices along with CMOS devices such as transistors, capacitors, resistors and the like in a single device, control circuitry can be formed along with the optical emission devices, forming a commercially useful integrated circuit. Furthermore an optical emission device that has the ability to dynamically vary the emission frequencies is desired as this would be key enabling technology for even more compact signaling devices or more compact display devices for visible light emissions.

Silicon based semiconductors typically produce electromagnetic energy in the form of infrared emissions due to the low quantum efficiency related to the indirect band gap that exists in silicon. Quantum dots formed in silicon have demonstrated higher quantum efficiency compared to bulk silicon, however even within the silicon quantum dots, intra-band transitions of less than ~1 eV are more prevalent, resulting in invisible infrared emissions when photons are emitted. Emissions of light in the visible spectrum are typically achieved in prior known solutions with devices formed using III-V compounds, such as gallium nitride (GaN), indium phosphide (InP) or indium arsenide (InAs), which have direct band gaps.

U.S. Patent Application Publication No. 2012/00098590, titled "Quantum Electro-Optical Device using CMOS Transistor with Reverse Polarity Drain Implant," with inventors Edwards et. al., published Apr. 26, 2012, which is co-owned with the present application and which is hereby incorporated by reference in its entirety herein, describes forming a quantum dot device using a CMOS process.

An electron volt (1 eV) is a common unit used in physics and is understood to be approximately equal to $1.6 \times 10^{-19}$ joules and a milli-electron volt (1 meV) is approximately equal to $1.6 \times 10^{-22}$ joules.

For photon emissions, the energy E and wavelength λ are related by equation 1

$$E = \frac{\hbar c}{\lambda} \text{ where } h \text{ is the Planck constant,} \quad \text{EQUATION 1}$$

$c$ is the speed of light.

Reduced as: $E(\text{eV}) = \frac{1239.84187 \text{ eV}}{\lambda(\text{nm})}$

Using Equation 1, it can be determined that photon emissions for visible light require at least 1.65 eV for red light and as much as 3.27 eV of energy for violet light. An energy level below 1.65 eV produces invisible infrared light and an energy level that is greater than 3.27 eV would also produce invisible light into the ultraviolet ranges and beyond.

The Heisenberg uncertainty principle, expressed in Equation 2, relates that as a position variable Δx becomes smaller, then the momentum variable Δp correspondingly becomes larger, as the product is a constant:

$$\Delta x \Delta p = \frac{\hbar}{2} \quad \text{EQUATION 2}$$

Where $x$ is position and $p$ is momentum (or energy) and $\hbar$ is the reduced Planck constant.

Because the position variable Δx in Equation 2 can be constrained (for example, by use of a quantum well), it can be seen that as a result the momentum or energy variable Δp can be increased, making the indirect bandgap of silicon irrelevant as a limitation on the energy. Equation 2 suggests the possibility of a device that enables inter-band energy transitions, that is, transitions from conduction-to-valence band transitions, where the electron energy change can be high enough to produce visible light. Further, it is also desirable to create emission devices that are capable of capture and re-emission of visible and invisible photons in a controlled fashion. An optical emission device is desired that can emit light in frequencies that are both invisible and visible, that can receive photons and store energy, and later again convert the stored energy to light emission in a controlled manner. An optical emission device with these functions has many applications, including applications in optical communications and photodetection. For practical and widespread use, the optical emission device should operate at room temperatures.

A continuing need thus exists for an optical emission device that is capable of controlled energy emission including visible light emission and with room temperature operation, and which is an optical emission device that can be fabricated using existing semiconductor process technologies. Further, a need exists for an optical emission device that is compatible with the fabrication of CMOS transistors to enable the production of a single integrated circuit that can include transistors along with the optical emission device.

SUMMARY

The arrangements that form various aspects of the present application provide an artificial exciton device in a CMOS semiconductor process. The arrangements include methods and apparatus for providing quantum wells to contain holes and electrons in electron hole pairs in close proximity. The artificial exciton device of the arrangements operates at room temperatures and is compatible with the simultaneous fabrication of MOS transistors enabling arrangements where the artificial exciton devices are formed along with MOS transistors on an integrated circuit.

In an example arrangement that forms an aspect of the present application, an artificial exciton device includes a semiconductor substrate; at least one well region in a portion of the semiconductor substrate and doped to a first conductivity type; isolation structures at a surface of the semiconductor substrate and positioned at a periphery of the at least one well region; a channel region defined at the surface of the semiconductor substrate in a central portion of the well region; a cathode region in the well region disposed spaced from one side of the channel region and doped to a second conductivity type opposite the first conductivity type; an anode region in the well region spaced from the channel region on a side opposite the cathode region, the anode region doped to the first conductivity type; a first lightly doped drain region in the at least one well region and disposed between the cathode region and the channel region, the first lightly doped drain region doped to the first conductivity type; a second lightly doped drain region in the at least one well region and disposed between the anode region and the channel region, the second lightly doped drain region doped to the second conductivity type; and a gate structure disposed on a surface of the semiconductor substrate and overlying the channel region, the gate structure comprising a gate dielectric layer lying over the channel region and a gate conductor material overlying the gate dielectric.

In another arrangement that forms a further aspect of the present application, a method for forming an artificial exciton device includes: providing a semiconductor substrate; implanting impurities in the semiconductor substrate to form a well region doped to a first conductivity type; depositing a gate dielectric over a surface of the semiconductor substrate, depositing a gate conductor over the gate dielectric, and then etching the gate conductor and the gate dielectric to form a gate structure overlying a channel region defined in a central portion of the well region; implanting impurities to dope the semiconductor substrate to the first conductivity type to form a first lightly doped drain region extending into the semiconductor substrate from the surface and disposed on one side of the channel region; implanting impurities to dope the semiconductor substrate to a second conductivity type that is opposite the first conductivity type to form a second lightly doped drain region extending into the semiconductor substrate from the surface on a side of the channel region opposite the first lightly doped drain region; implanting impurities to dope the semiconductor substrate to the second conductivity type to form a cathode region extending from the surface of the semiconductor substrate deeper than the first lightly doped drain region, the cathode region spaced from the channel region by a portion of the first lightly doped drain region; and implanting impurities to dope the semiconductor substrate to the first conductivity type to form an anode region extending from the surface into the semiconductor substrate deeper than the second lightly doped drain region, the anode region spaced from the channel region by a portion of the first lightly doped drain region.

In still another arrangement that forms additional aspects of the present application, an integrated circuit includes: at least one artificial exciton device formed in a first well region in a semiconductor substrate that is doped to a first conductivity type, the artificial exciton device further comprising: a cathode region in the first well region disposed spaced from one side of a channel region defined in a central portion of the well region, and doped to a second conductivity type opposite the first conductivity type; an anode region in the first well region spaced from the channel region on a side opposite the cathode region, the anode region doped to the first conductivity type; a first lightly doped drain region in the first well region and disposed between the cathode region and the channel region, the first lightly doped drain region doped to the first conductivity type; a second lightly doped drain region in the first well region and disposed between the anode region and the channel region, the second lightly doped drain region doped to the second conductivity type; and a gate structure disposed on a surface of the semiconductor substrate and overlying the channel region, the gate structure comprising a gate dielectric layer lying over the channel region and a gate conductor material overlying the gate dielectric; wherein the artificial exciton device further comprises a first quantum well configured to contain holes in quantized energy states and a second quantum well configured to contain electrons in quantized energy states, the electrons and holes forming electron hole pairs; and at least one MOS transistor disposed in the first well region adjacent the artificial exciton device, and further comprising: a first source/drain region in the first well region disposed spaced from one side of a MOS channel region defined in a central portion of the first well region, and doped to a second conductivity type opposite the first conductivity type; a second source/drain region in the first well region disposed spaced from another side of the MOS channel region opposite the first source/drain region, the second source/drain region doped to the first conductivity type; a first MOS lightly doped drain region disposed between the first source/drain and the MOS channel region, the first MOS lightly doped drain region doped to the second conductivity type; a second MOS lightly doped drain region disposed between the second source/drain region and the MOS channel region, the second MOS lightly doped drain region doped to the second conductivity type; and a MOS gate structure disposed on a surface of the semiconductor substrate and overlying the channel region, the MOS gate structure comprising a gate dielectric layer lying over the channel region and a gate conductor material overlying the gate dielectric.

Recognition is made in the present application that an artificial exciton device can be fabricated in a MOS semiconductor process. The arrangements provide artificial exciton devices having a cathode, a gate and an anode region which can be operated in various modes by applying potentials to corresponding terminals of the device. Applications include photodetection and photoemission of invisible and visible light.

BRIEF DESCRIPTION OF THE DRAWINGS

For a more complete understanding of the illustrative examples of aspects of the present application that are described herein and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the illustrative example arrangements and are not necessarily drawn to scale.

DETAILED DESCRIPTION

Figure 1:
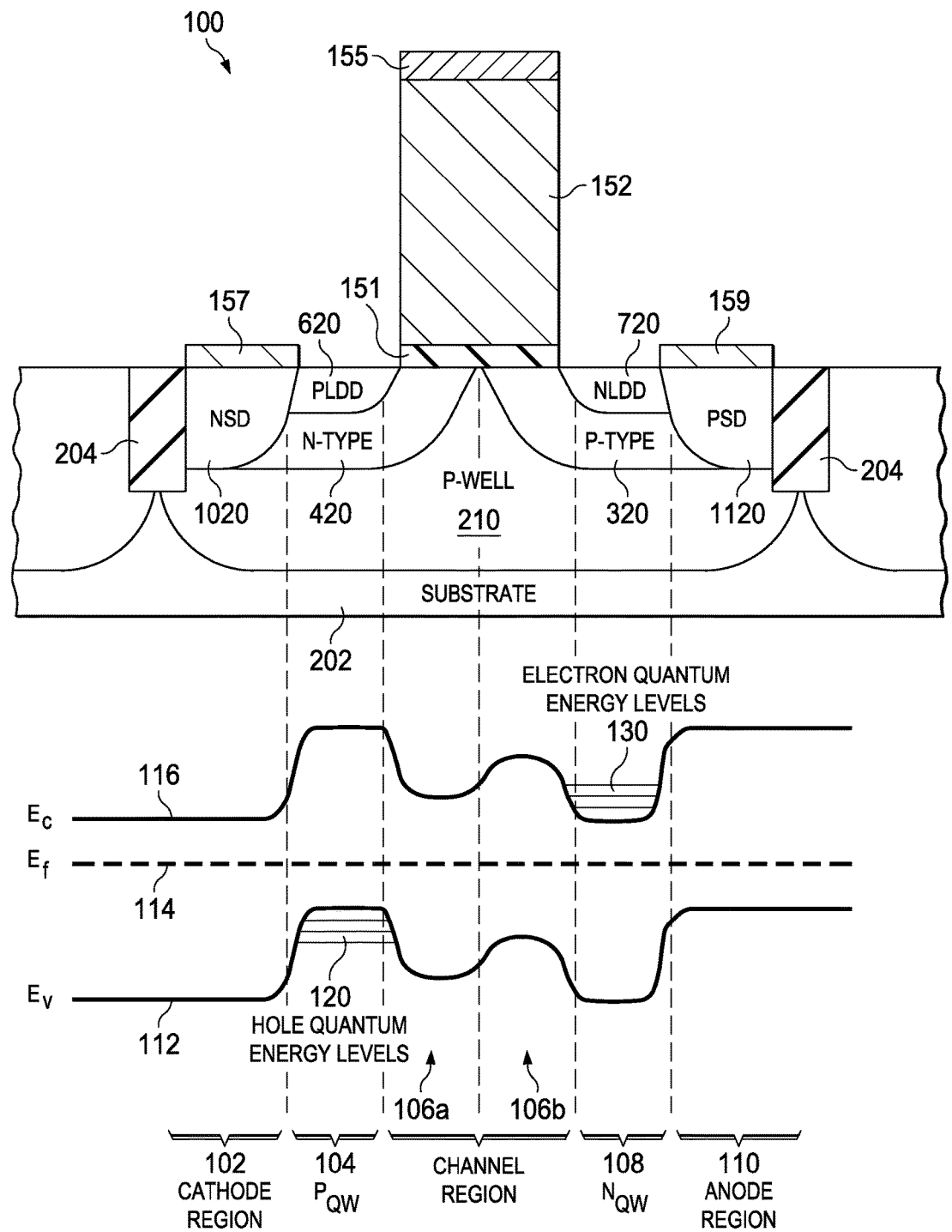
FIG. 1 depicts in a simplified cross-sectional view an example artificial exciton device (AED) of the arrangements and the associated spatial energy band diagram for the AED device.

The making and using of various example illustrative arrangements that incorporate aspects of the present application are discussed in detail below. It should be appreciated, however, that the illustrative examples disclosed provide many applicable inventive concepts that can be embodied in a wide variety of specific contexts. The specific examples and arrangements discussed are merely illustrative of specific ways to make and use the various arrangements, and the examples described do not limit the scope of the specification, nor do they limit the scope of the appended claims.

For example, when the term "coupled" is used herein to describe the relationships between elements, the term as used in the specification and the appended claims is to be interpreted broadly, and while the term "coupled" includes "connected", the term "coupled" is not to be limited to "connected" or "directly connected" but instead the term "coupled" may include connections made with intervening elements, and additional elements and various connections may be used between any elements that are described as "coupled."

The present arrangement describes the formation of doped diffused regions in a CMOS compatible semiconductor process. As is known to those skilled in the art, for MOS transistor devices the designation "source" and "drain" refers to the electrical connection of these regions, and in a cross sectional view of the physical structure of MOS devices, the "source" and "drain" are typically identical and symmetrical doped diffusion regions formed on opposing sides of the transistor gate. Because these regions are structurally identical, the two regions can be substituted for one another without changing the device in any way and so when the text describes a region as a "source" region herein, it is contemplated that it may also be a "drain" region, while a "drain" region can also be connected as a "source" without modification of the regions. To clarify that these regions are physically equivalent, and that the eventual electrical connection to the region determines whether the diffusion acts as a "source" or a "drain," the term "source/drain diffusion region" is used.

In arrangements of the present application, an artificial exciton device (AED) is provided in a MOS semiconductor process. An exciton is an electron-hole pair that is provided as a bound pair. In the arrangements disclosed herein, an AED provides an exciton in a quasi-bound state in a semiconductor substrate such as silicon. In the arrangements, the AED includes two quantum wells for containing electrons and holes bound in close physical proximity. The electrons and holes can, under certain conditions, be allowed to recombine, resulting in photon emission. A gate terminal of the AED device provides control of the quantum well potentials and thereby allows the photon emission to be controlled. Additional modes of operation allow a photon to be detected by the AED and stored as an exciton. The AED device has additional terminals that allow electrical reading of the state of the AED cell, and which enable an electrical charge to be input to the cell and stored as an electron-hole pair. After an electron-hole pair is stored, a photon can be emitted as a controlled event by applying various signals to the terminals of the device.

In one arrangement that forms an aspect of the present application, the AED device is fabricated in a MOS semiconductor process by substituting an impurity dopant type of a lightly doped drain (LDD) implant on one side of a MOS gate structure to an opposite polarity impurity type, and by substituting the impurity dopant type of a source/drain implant on the other side of the gate with the opposite polarity impurity type. In this manner, the AED is produced by modifying the regions of a conventional CMOS transistor to form two quantum wells for the electron-hole pair. In another arrangement, the AED is produced using angled implants to modify the LDD implants of both polarities of the MOS transistor devices to form the AED.

Because the various ion implant steps used in forming the AED are similar to those already used in the MOS fabrication process, the novel process used to produce the AED is low cost, and further, the process can also simultaneously produce NMOS and/or PMOS transistors in the same integrated circuit as the AED device. In this manner control, computation and input/output circuitry can be formed alongside the AED devices, making a single integrated circuit with all the required circuitry for use of the AED device in a system easily manufacturable in existing semiconductor processes. In an alternative approach that is also contemplated as forming an additional aspect of the present application, the AED devices can be formed on a stand along integrated circuit device without the additional NMOS and PMOS devices.

FIG. 1 depicts in a simplified cross sectional view portions of an example arrangement for an AED device 100 and the associated spatial energy band diagram for the artificial exciton device. In FIG. 1, a P-type substrate 202 is shown with a P-well 210 isolated by shallow trench isolation regions 204. A gate dielectric 151 is covered with a gate 152. Silicide regions 155, for the gate, 157 for a cathode, and 159 for an anode, provide metal silicide contacts for making electrical connections to the gate, cathode and anode terminals of the AED 100. A source/drain diffusion region 1020 for the cathode is doped to an N-type conductivity, and a source/drain diffusion region 1120 is doped to a P-type conductivity to form the anode for the AED. Lightly doped drain (LDD) regions 620 and 720 are formed on opposing sides of the gate. The region 620, labeled PLDD, is doped to P-type conductivity, while the region 720, labeled NLDD, is doped to N-type conductivity. These shallow lightly doped regions extend from the surface of the substrate 202 into the substrate between the gate and the source/drain diffusion regions 1020 and 1120, respectively. Deeper pocket implant regions 420, for the cathode side of the gate, and 320, for the anode side of the gate, are also shown in FIG. 1. These pocket implants 420 and 320 are optional but can be included in the arrangements to increase performance of the AED. The pocket implant 420 is doped to the N-type conductivity and the pocket implant 320 is doped to P-type conductivity.

The energy band diagram in FIG. 1 plots a conduction band ($E_c$) 116, a valance band ($E_v$) 112 and the Fermi level ($E_f$) 114 that correspond to various regions in the AED device 100; a cathode region 102, a P-type quantum well ($P_Qw$) 104, channel regions under the gate 106a and 106b, an N-type quantum well ($N_Qw$) 108 and a P-type anode region 110. In the formation of the $P_Qw$ and $N_Qw$ regions, the processes depicted in the various illustrations below results in those quantum well regions spanning a width from about 10 nm to about 20 nm, and preferably less than 15 nm. Following the diagram of FIG. 1 from left to right, the cathode region 102 is doped to an N-type conductivity which results in the conduction band $E_c$ 116 being a few meV higher than the Fermi level $E_f$ 114 at the left edge of the diagram. Within the $P_Qw$ 104, the P-type conductivity causes the $E_c$ 116 to rise from the $E_f$. The level of the conduction band $E_c$ 116 falls closer to the level of the Fermi band $E_f$ through the channel region 106a. Still referring to the conduction band 116, the level of the conduction band $E_c$ rises again as it enters the channel region 106b. The $E_c$ drops again to a few meV above the Fermi level of $E_f$ 112 within the $N_Qw$ region 108. In the p-type anode region 110 the conduction band $E_c$ rises again.

In operation of the AED 100, the quantum well $N_Qw$ 108 can contain electrons. Electrons contained within the well region $N_Qw$ 108 exist in quantized energy levels depicted in FIG. 1 as 130. As the well region 108 decreases in width (constraining the position variable $\Delta x$ in Equation 2), the gap in the energy levels 130 increase (corresponding to the increase in energy variable $\Delta p$ in Equation 2). Similarly, the quantum well created in the valence band $E_v$, $P_Qw$ 104 can contain holes (an electron acceptor position) in discrete energy levels 120. Those familiar with the Heisenberg uncertainty principle, shown in Equation 2, will recognize that as the $P_Qw$ region 104 is reduced in width ($\Delta x$ is constrained in Equation 2), the gap in the hole energy bands 120 ($\Delta p$ in Equation 2) will correspondingly increase.

Figure 2:
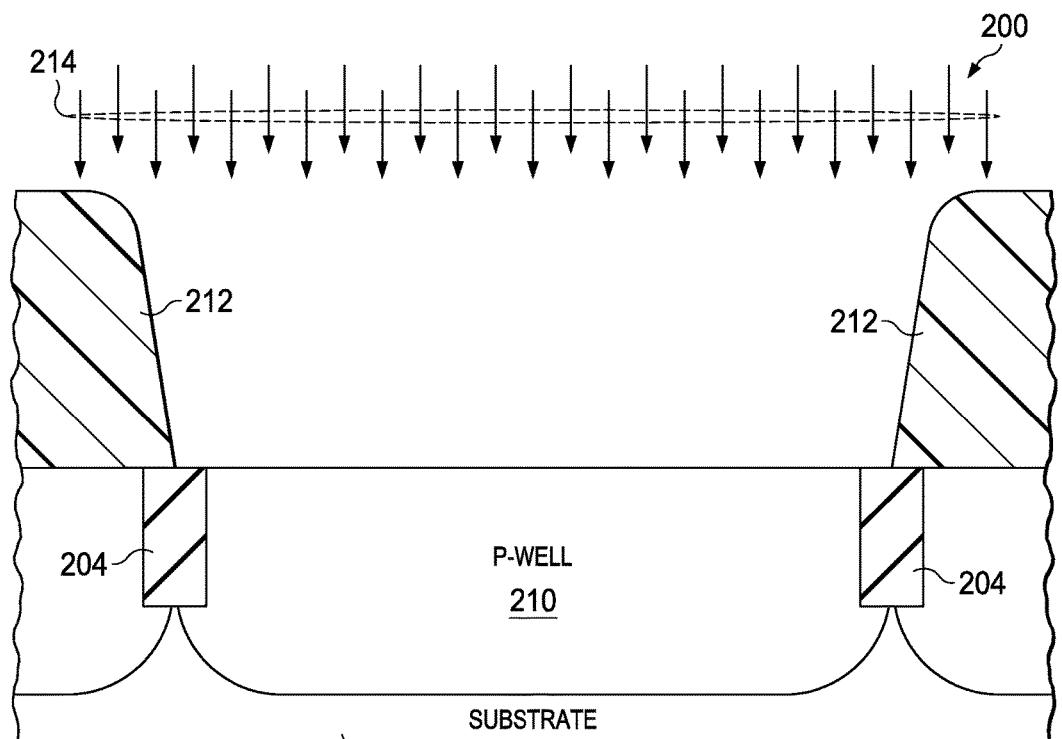
FIG. 2 is the first in a series of cross-sectional views depicting the successive processing steps used to manufacture an artificial exciton device using a CMOS semiconductor process.

FIG. 2 depicts the first in a series of cross sections presented that illustrate successive steps performed in construction of an AED 200 within an integrated circuit CMOS process. A person skilled in the relevant art will recognize that there are alternative methods and orders of steps by which to accomplish the construction of the AED and that this non-limiting example of fabrication is only one of those methods for this configuration. In addition, in this first example arrangement, the AED 200 is built by modifying portions of a process for forming an NMOS transistor formed within a CMOS process, yet it could as easily be formed as a modified PMOS transistor within the CMOS process. The semiconductor substrate 202 that hosts the AED (and, in some arrangements that form aspects of the present application, also hosts other MOS transistor devices) can typically be a P-type single crystal silicon substrate. It is also within the scope of the present application to form an AED in any substrate that supports fabrication of an integrated circuit in a CMOS process including, but not limited to silicon-on-insulator (SOI) or a hybrid orientation technology (HOT) substrate, or on any epitaxial layer compatible with CMOS semiconductor fabrication. Furthermore, it is contemplated that the same quantum structures can be formed in III-V semiconductor compounds such as, but not limited to, gallium nitride (GaN), indium phosphide (InP) and indium arsenide (InAs). These compounds can be full substrates or can simply be epitaxial layers on other host substrates.

In FIG. 2, electrically isolated regions or wells in a semiconductor substrate 202 are created using, in one example arrangement, a shallow trench isolation (STI) process in which trenches or moats 204, commonly 200 to 500 nanometers (nm) deep that are etched into the substrate 202. The trenches 204 can be filled with a dielectric material using thermal oxidation and HDP, PECVD or other dielectric deposition methods. Alternative isolation approaches between the wells include forming LOCOS (localized oxidation of silicon) regions. Subsequently, a photoresist for patterning P-wells is selectively applied on the wafer surface leaving exposed regions to be implanted with P-type impurities 214 such as, for a non-limiting example, boron in concentrations from $1 \cdot 10^{11}$ to $1 \cdot 10^{14}$ atoms/cm². The implant forms P-wells 210 which extend from a top surface of the substrate 202 to a depth typically 50 to 500 nm below the bottom of the moats 214. The adjoining wells (partially visible in FIG. 2 on either side of P-well 210) can be doped to P-type or N-type conductivity, depending on the dopant applied for the desired transistor type. Once the ion implantation forming P-wells 210 is completed, the photoresist 212 can be removed using known photoresist strip and clean processes leaving the P-well 210 electrically isolated by the STI moats 204.

Figure 3:
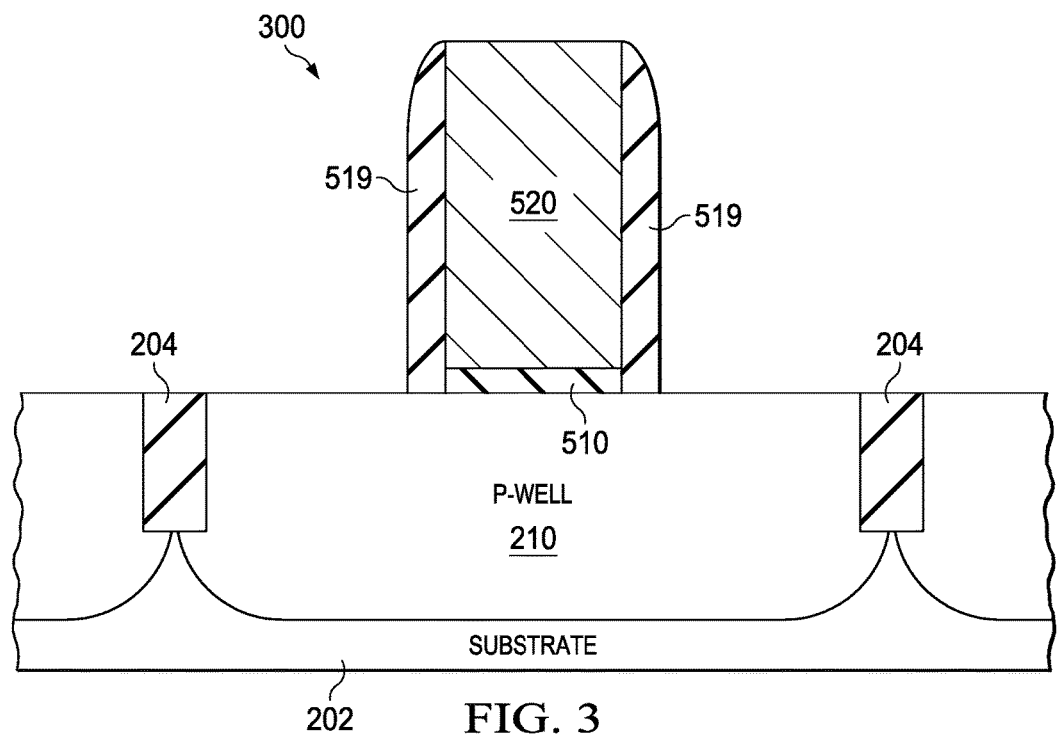
FIG. 3 is a next step in the series depicting a cross-sectional view of the construction of an AED such as the one illustrated in FIG. 2 and forming a gate structure.

FIG. 3 depicts a next step in a cross-sectional view of the construction of an AED 300 illustrating the fabrication of a gate insulator and gate structure. In FIG. 3, an AED gate dielectric layer 510, typically of silicon dioxide, hafnium oxide or other insulating materials and having a thickness between about 1 nm and about 30 nm is formed on the top of the substrate 202 by known methods in a central portion of the well region 210. In one arrangement that forms an aspect of the present application, NMOS gate and PMOS gate dielectric layers or gate insulators (not shown in FIG. 2) in other portions of the substrate 202 can be fabricated with similar materials and similar thicknesses, and can be formed concurrently in time with the AED gate dielectric 510. Alternatively the PMOS and NMOS gate dielectrics can be formed independently of the AED gate dielectric of different materials and/or thicknesses.

Still referring to FIG. 3, an AED gate 520 is formed on top of the gate dielectric 510. The gate 520 is typically formed from polycrystalline silicon, referred to as polysilicon. The polysilicon is deposited over the AED gate dielectric layer and can also be deposited over NMOS and PMOS gate dielectric layers (not shown) to form NMOS and PMOS gate structures elsewhere on the substrate 202. A gate photoresist pattern, not illustrated for simplicity, is then applied over the gate material and patterned for an etch process. Any unwanted gate polysilicon and the unwanted portions of the underlying gate dielectric are removed by known etching methods. The gate photoresist is then also removed. The gate structures for any NMOS and/or PMOS transistors that are disposed in wells other than wells 210 can be simultaneously patterned while the AED gate polysilicon 520 is formed. In some arrangements that form additional aspects of the present application, a replacement gate such as a metal gate can be used to replace the polysilicon gate 520 at a later processing step. As shown in FIG. 3, gate spacers 519 are then formed of an insulator such as an oxide, oxynitride, or nitride layer. The gate spacers 519 can be formed by oxide growth on the polysilicon 520 and gate dielectric 519, or by other known means. The gate spacers are patterned by an anisotropic etch step. As for other steps described herein, gate structures for NMOS and/or PMOS devices being contemporaneously fabricated on substrate 202, not visible in FIG. 3, can be formed simultaneously.

Figure 4:
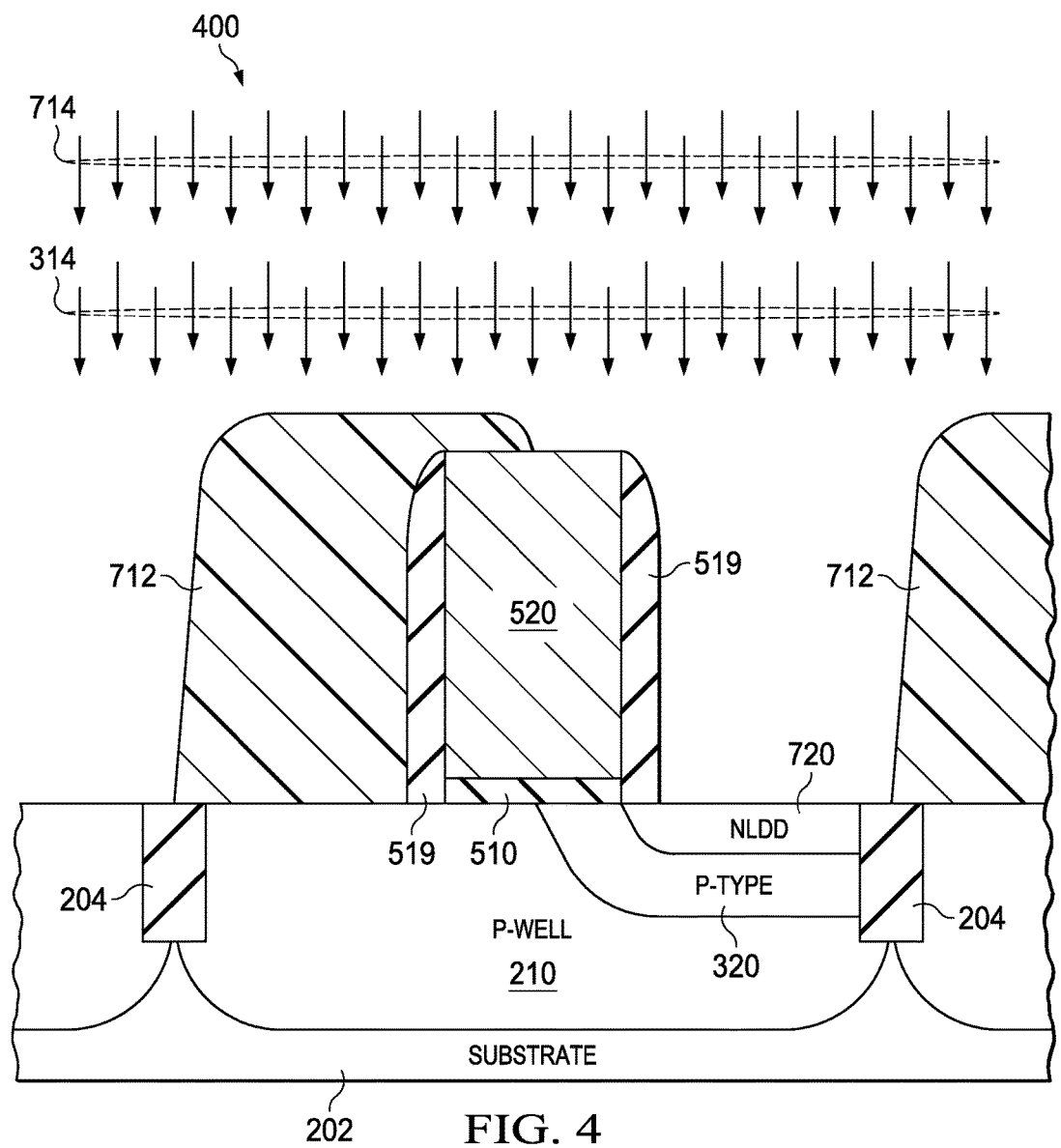
FIG. 4 is a next step in the series depicting a cross-sectional view of the construction of an AED such as the one illustrated in FIG. 3, illustrating a photoresist and ion implantation.

FIG. 4 depicts a next step in a cross-sectional view of the construction of an AED device 400 illustrating another photoresist and a series of ion implantation steps. In FIG. 4 photoresist 712 is applied to the surface of the substrate 202 and patterned leaving openings for implanting P-type impurities to form an optional pocket regions 320, and then using the same photoresist 712, implanting N-type impurities 714 to form N-type lightly doped drain (NLDD) regions 720. The gate spacer 519 is used to space the ion implant dopants from the channel region under the gate 520. The photoresist 712 extends to cover a portion of the gate structure 520, so that the surface of the substrate 202 that lies beneath the photoresist 712 on one side of the gate structure is masked, while the surface of the well 210 opposite and on the other side of the gate 520 is open for implantation. Note that while the implants shown for the AED device 700 are being performed, additional implants of P-type pocket implants, and other N-type LDD regions, can be formed in other NMOS and PMOS transistor regions (not visible in FIG. 4.) P-type dopants 314 are first implanted, in one arrangement, to form P-type pocket regions 320. The impurities 314 in the P-type implant can be boron, gallium or indium, for example, in concentration ranges from about $1 \times 10^{11}$ to about $1 \times 10^{14}$ atoms/cm$^2$. The implant of the dopants 314 can be performed at an angle or tilt to reach the substrate beneath the gate spacers 519 as shown. The N-type implantation 714 then is performed to form the lightly doped drain region 720 (NLDD). The impurities used in the N-type implant 714 can be phosphorus and arsenic in concentration ranges from about $1 \times 10^{13}$ to about $5 \times 10^{14}$ atoms/cm$^2$, for example. After the implanting step, the photoresist 712 can be removed with known processes.

Figure 5:
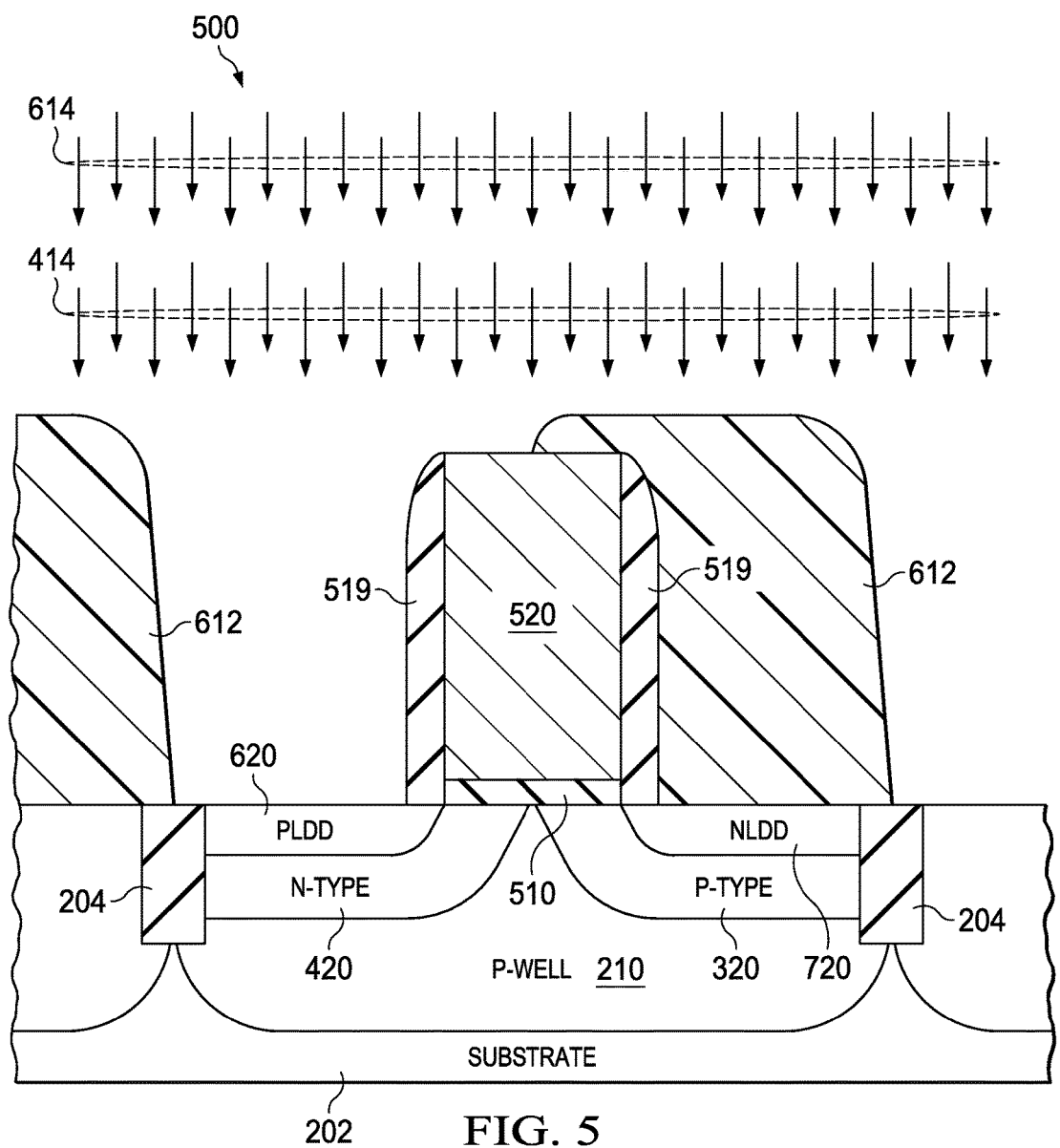
FIG. 5 is a next step in the series depicting a cross-sectional view of the construction of an AED such as the one illustrated in FIG. 4, illustrating another photoresist and ion implantation step.

FIG. 5 depicts a next step in a cross-sectional view of the construction of an AED 500 illustrating another photoresist 612 used for an optional N-type pocket implant and a P-type LDD implant. A photoresist 612 is applied to the surface of the substrate 202 leaving openings for implanting. An optional N-type pocket region 420 is formed by implant 414. Gate spacers 519 again space the implanted ions from the channel region beneath the gate 520. The dopants in the N-type implant 414 can be phosphorus and arsenic, for example, in concentration ranges about $1 \times 10^{13}$ to about $1 \times 10^{14}$ atoms/cm$^2$. The N-type implant for the pocket 420 can be performed using a tilt or angled implant to reach the substrate 202 beneath the gate spacer 519 as shown. The pocket ion implant step can also be used to form pocket regions for NMOS and/or PMOS transistors on other portions of substrate 202, not visible in FIG. 5.

Again using the photoresist 612, P-type ions 614 are implanted and form P-type lightly doped source/drain (PLDD) region 620. The impurities in the P-type implant 614 can be boron or gallium and or indium in concentration ranges of $1 \times 10^{13}$ to $5 \times 10^{14}$ atoms/cm$^2$. Note that the optional N-type pocket ion implant 414 and the PLDD ion implant 614 use the same photoresist 414 and the same photomask is used for both implant steps. Further, the photoresist 612 can be used to form P-type LDD regions for other NMOS and PMOS devices formed elsewhere on the substrate 202 (not shown in FIG. 5). After the implanting steps, the photoresist 612 is removed with known processes.

Figure 6:
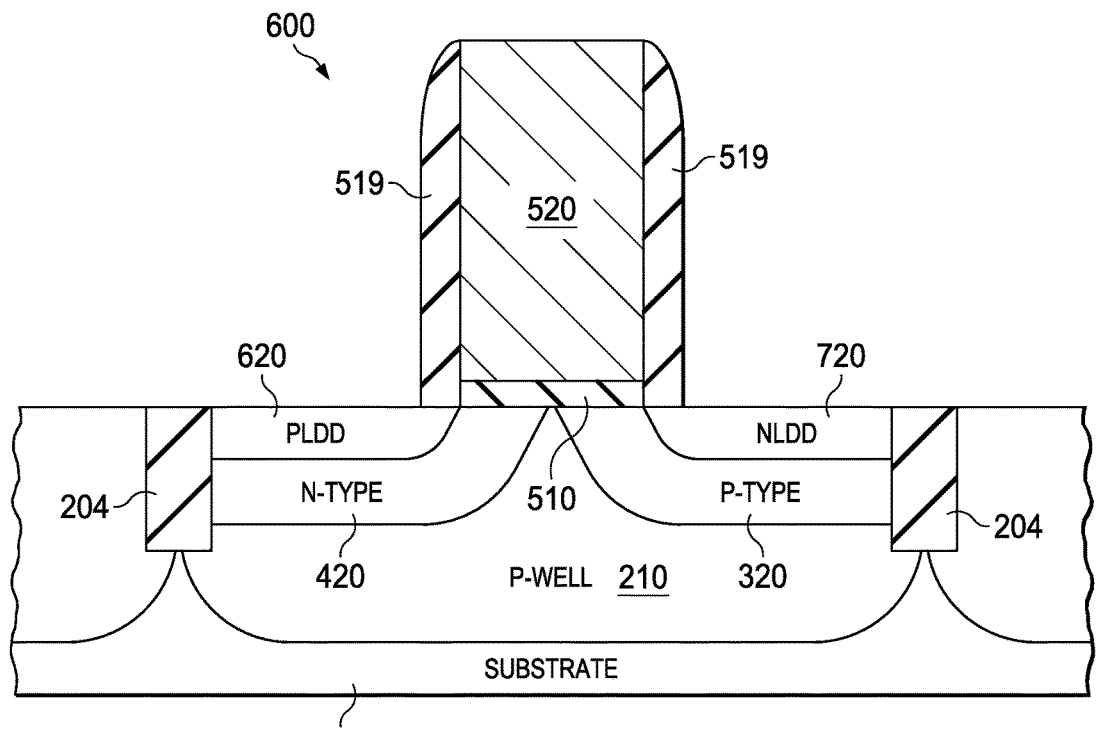
FIG. 6 is a next step in the series depicting a cross-sectional view of the construction of an AED such as the one illustrated in FIG. 5.

FIG. 6 illustrates in a cross-sectional view an AED 600 depicting doped regions within the active region after an anneal step to complete the doped regions. The doped regions are the P-well 210, the P-type pocket region 320, the N-type pocket region 420, the PLDD region 620 and NLDD region 720. For the operation of the AED device, the P-type pocket region 320 and N-type pocket region 420 are a low cost or no-cost addition to the process (as the MOS process for transistors also uses these pocket implants) and they help improve the performance of the AED device and the quantum wells. However, those pocket regions 420, 320 are optional and in another alternative process that is contemplated as forming an additional arrangement of the present application, they can be excluded. At this stage in the processing of the AED 600, portions of the implanted doped regions 720, 620, 420, 320 can be activated by performing a thermal anneal. Anneals can be performed using known methods such as rapid thermal processing (RTP) or laser annealing or by use of an oven. In an alternative approach, thermal processing can be performed between some of the steps described above.

Figure 7:
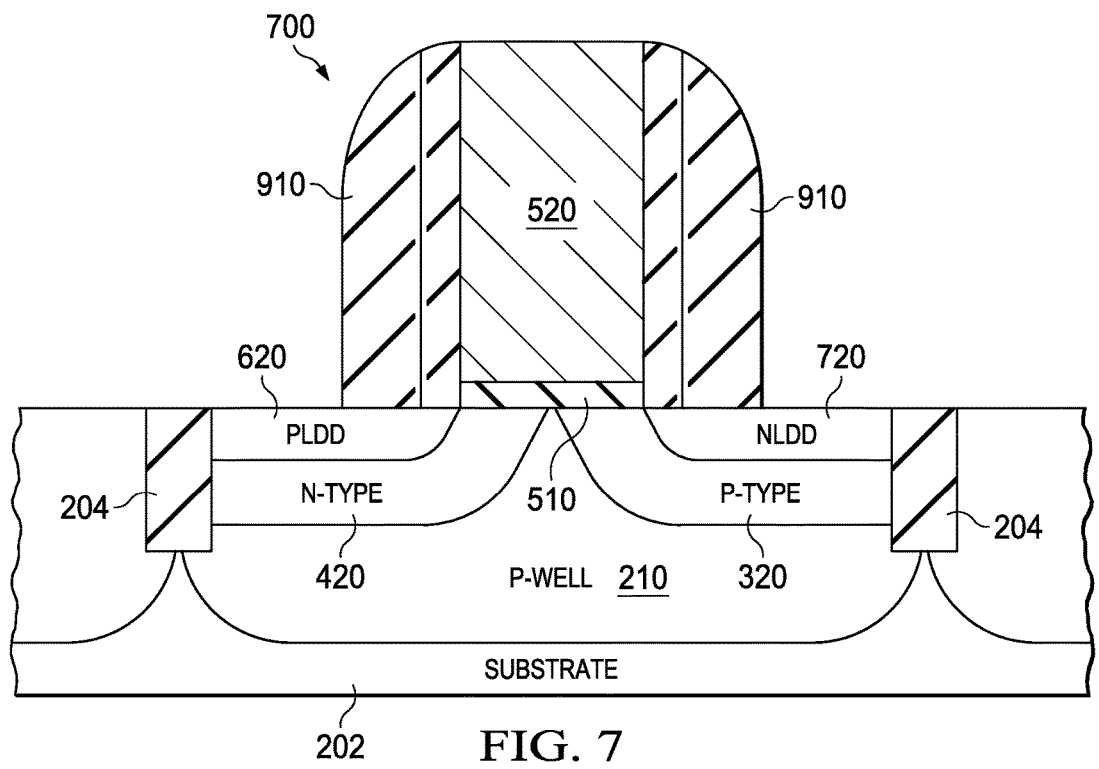
FIG. 7 is a next step in the series depicting a cross-sectional view of the construction of an AED such as the one illustrated in FIG. 6, illustrating gate sidewall formation.

FIG. 7 depicts a next step in the process in a cross-sectional view of the construction of an AED 700 illustrating creation of gate spacers. AED gate spacers 910 are formed on the lateral surfaces of the AED gate 520 and over the sidewall spacers 519. The gate spacers 910 are typically formed from a layer of silicon dioxide between 1 and 10 nm thick. Other dielectric materials can also be used. The gate spacers 910 can commonly be formed by oxidation of the polysilicon of the AED gate 520 or by conformal deposits silicon dioxide and/or silicon nitride. The AED gate spacers 910 can have a different thickness than NMOS or PMOS gate spacers also formed on the substrate 202, or can be the same thickness. After formation the gate spacers 910 are patterned and/or etched to remove any unwanted deposited material.

Figure 8:
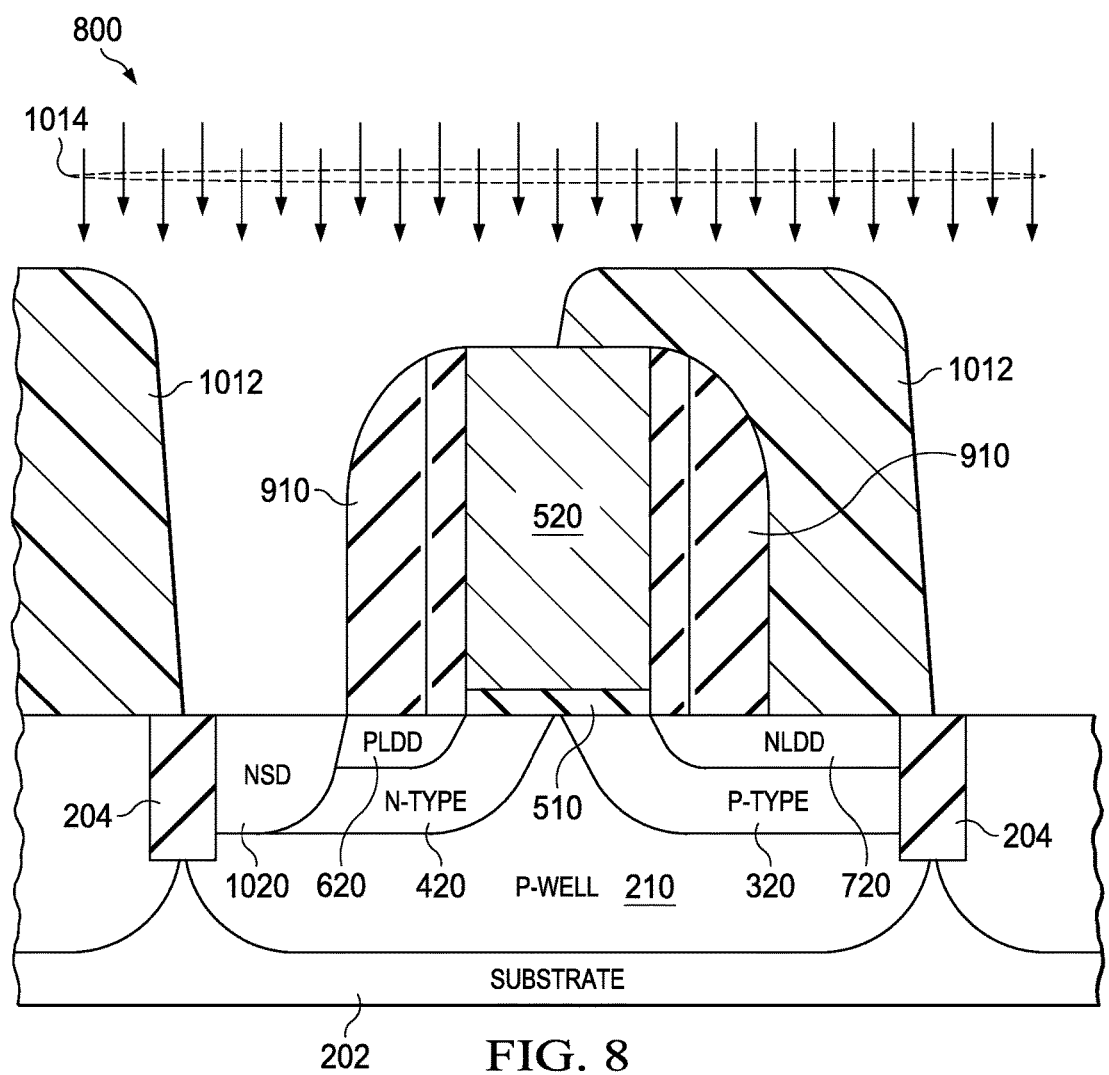
FIG. 8 is a next step in the series depicting a cross-sectional view of the construction of an AED such as the one illustrated in FIG. 7, illustrating forming doped source/drain regions in the active silicon region.

FIG. 8 depicts a next step in another cross-sectional view of the construction of an AED 800 illustrating an N-type source-drain implant in a cathode region 1020. In FIG. 8 a photoresist 1012 is applied to the surface of the wafer and patterned leaving openings for implanting ions into to form a cathode region 1020 for the AED. The impurities in the N-type implant 1014 can be phosphorus and arsenic, for example, in concentration ranges from about $1\times10^{14}$ to about $5\times10^{16}$ atoms/cm$^2$. After the ion implantation, the photoresist 1012 is removed with known processes. Note that the ion implantation 1014 can be used to form N-type source drain regions elsewhere on the substrate, for NMOS transistors, for example that are not visible in FIG. 8.

Figure 9:
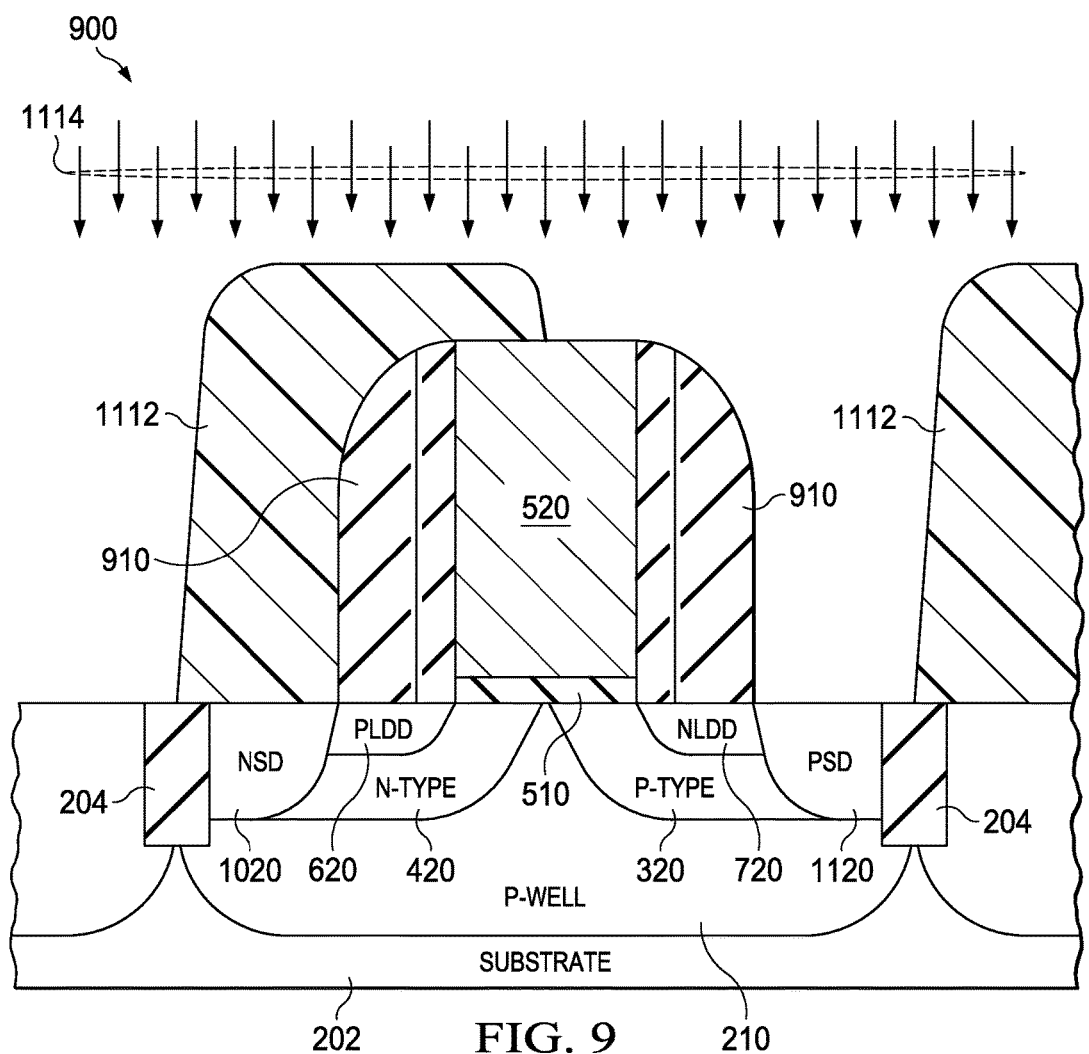
FIG. 9 is a next step in the series depicting a cross-sectional view of the construction of an AED such as the one illustrated in FIG. 8, illustrating another source/drain implant.

FIG. 9 depicts a next step in the process in a cross-sectional view of the construction of an AED 900, illustrating a P-type source-drain implant. A photoresist 1112 is applied to the surface of the substrate 202 and patterned leaving openings for implanting source/drain region 1120 on the anode side of the AED. P-type dopants 1114, typically boron and possibly gallium or indium, are ion implanted into the top of the NLDD region 720 to a depth of from about 25 to about 250 nanometers at a total dose typically between form about $1\times10^{14}$ to about $5\times10^{16}$ atoms/cm$^2$. The source/drain region 1120 extends through the NLDD region 720 and into the pocket implant 320 (if it is present). The photoresist 1112 can then be removed with known processes. Note that the P-type source drain implant and photoresist 1112 can be used to form source/drain regions for other transistors on substrate 202, such as PMOS transistors, that are not visible in FIG. 9.

Still referring to FIG. 9, an anneal operation is performed on the substrate 202 using known RTP or laser annealing methods which activates the N-type dopants in the NSD region 1020 and the P-type dopants in the PSD region 1120.

Figure 10:
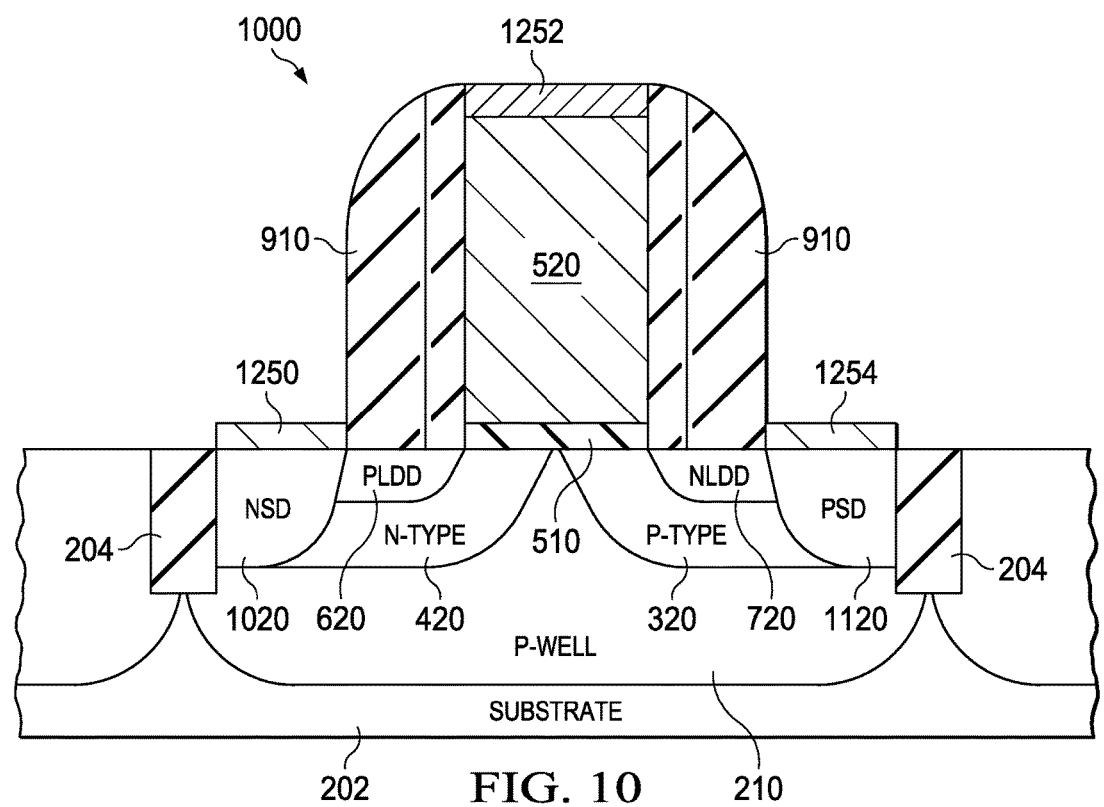
FIG. 10 is a next step in the series depicting a cross-sectional view of the construction of an AED such as the one illustrated in FIG. 9, illustrating metal silicide deposition.

FIG. 10 depicts a next step in a cross-sectional view of the construction of an AED 1000 illustrating a metal contact deposition. In one arrangement, the polysilicon in the AED gate 520, NSD region 1020 and PSD region 1120 are partially replaced by metal or metal silicide by known processes. For one non-limiting example, nickel may be deposited on the top surfaces of the AED gate 512, NSD region 1020 and PSD region 1120 followed by heating of the substrate 202 to react the nickel with the underlying polysilicon to form metal silicide. A wet etch, or other known process, can be employed to selectively remove the unreacted nickel leaving the metal silicide layer forming AED cathode 1250, the AED gate contact 1252 and on the AED anode 1254. Other metals can be used. Silicide contacts can simultaneously be performed in other portions of the substrate 202 and form silicide contacts for NMOS or PMOS transistors elsewhere in the substrate.

Figure 11:
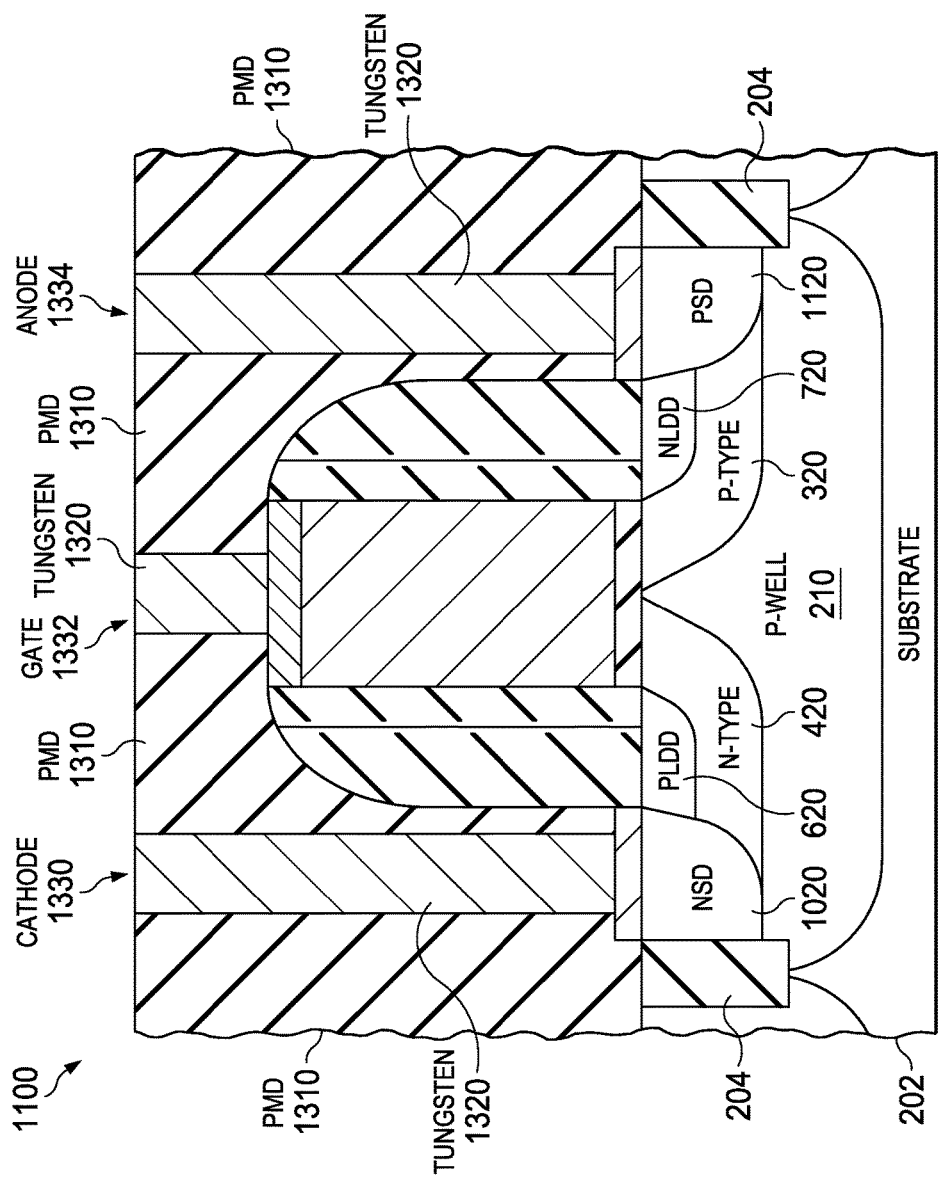
FIG. 11 is a next step in the series depicting a cross-sectional view of the construction of an AED such as the one illustrated in FIG. 10, illustrating pre-metal dielectric and contact tungsten formation.

FIG. 11 depicts in another cross-sectional view the construction of an AED 1100 illustrating forming pre-metal dielectric (PMD) and tungsten conductors. Referring to FIG. 11, a PMD layer 1310, typically consisting of thin layer of silicon nitride or silicon dioxide, deposited 10 to 100 nanometer thick, is followed by formation of a 100 to 1000 nanometer layer of silicon dioxide or phosphor-silicate glass (PSG). In one example process, the PMD layers can be deposited using PECVD and then can be planarized by a chemical-mechanical polish (CMP) process. An optional PMD top layer, commonly 10 to 100 nanometers thick of a hard material such as silicon nitride or silicon carbide can be formed on the top surface of the substrate 202. Alternative known processes for forming PMD layers can be performed. AED cathode contact 1330, AED gate contact 1332 and AED anode contact 1334 which make physical and electrical contact with the metal silicide contacts below them are formed in the PMD layer 1310 by known methods, including using a photoresist pattern on the top layer of the PMD to expose the contact area, etching contact holes thru the PMD down to the metal silicide on the substrate 202 and filling the contact holed with a contact liner and subsequently forming contact fill metal, typically tungsten 1320. The processes described here are non-limiting examples and other alternative processes for forming the contacts can be performed and these alternatives form additional arrangements of the present application.

After the contacts are formed as illustrated in FIG. 11, the AED device is essentially complete. As shown in FIG. 1, a pair of quantum wells $P_Qw$ and $N_Qw$ is formed that can contain holes and electrons. An exciton, a bound electron-hole pair, can then be stored by the AED. Using the gate terminal, the potentials can be controlled and under control of the cathode, gate and anode terminals, a photon can be released. Alternatively, a photon can be detected resulting in a stored electron-hole pair in the exciton that can be released as a photon at a later time. The AED can have an electron-hole pair stored in it electronically, and the state of the AED can be read electronically, so that the AED can act as a data storage device, as well.

Table 1 indicates the basic operation of the three terminal AED, such as 1100 in FIG. 11. A combination of the modes, accomplished by external circuitry coupled to the cathode, gate and anode terminals, can enable other, more complex functionality. An example is the use of the AED in selective frequency communications. The AED can start in "Selective Photo Detector" mode as in the first row of the table, and in this mode can be configured to detect photons of a particular frequency. The gate potential can be varied to change the quantum well valence and conduction band levels, thereby setting the photon detector frequency. Once a photon is received, the AED stores an electron-hole pair. As shown in the second row of Table 1, "Selective Photon Emissions" the AED can also emit photons. Because the gate potential affects the conduction and valence band level, the AED can also selectively alter the electron-hole energy levels and then re-transmit the photon as a different frequency or visible color. This can be done by placing the AED device in a photodetection mode, with the AED in reverse bias, and varying the potential on the gate terminal. The gate potential will change the levels of the conduction and valence bands, so that when a photon is captured by the exciton as an electron hole pair, it will be released later in an emission mode as a photon of a different color (frequency change).

Another function the AED can perform is a lasering action where the AED is put in emission mode with the gate set to emit a particular frequency light. Then, with a pulse on the cathode, a burst of emissions at the desired frequency can be emitted. At that point, the excitons will need to be replenished in that particular device. Arraying a series of the AEDs together and firing in sequence as ready can give the effect of a continuous laser. Note that a cavity is also needed in the exciton in this mode to confine the light so that stimulated emission needed for the laser is possible.

The anode and cathode terminals of the AED 1100 can also be used with the gate to create an electron-hole pair in the device electronically, which can then be emitted as a photon under the control of the gate terminal at a later time. Further, the cathode, anode and gate terminals can be used to read the state of the AED, that is, to indicate electrically whether an electron-hole pair is stored. In this way a photodetector can be configured using the AED. The AED can also act as a memory or data storage device, and since the stored data can be used to emit a photon, the AED device can act as an optical transceiver in an optical network. In addition the AED can emit visible light and thus can be used as a programmable light source. The AED can emit non-visible light as used in remote controls and other applications and can be used as a controller for devices that receive infrared or ultraviolet input signals.

TABLE 1

| Mode | Terminal | Potential | Functionality |
|---|---|---|---|
| Selective Photo Detector | Cathode | Positive | Positive Cathode leads to photon absorption. Gate modulates QW level resulting in selective photon detection by creating electron-hole pairs. |
| | Gate | 0 V to Positive | |
| | Anode | 0 V | |
| Selective Photon Emissions | Cathode | 0 V | Positive Anode encourages recombination of electron-hole pairs which emits photons. Gate modulates QW level and sets frequency/color of light emissions. |
| | Gate | 0 V to Positive | |
| | Anode | Positive | |

Figure 12:
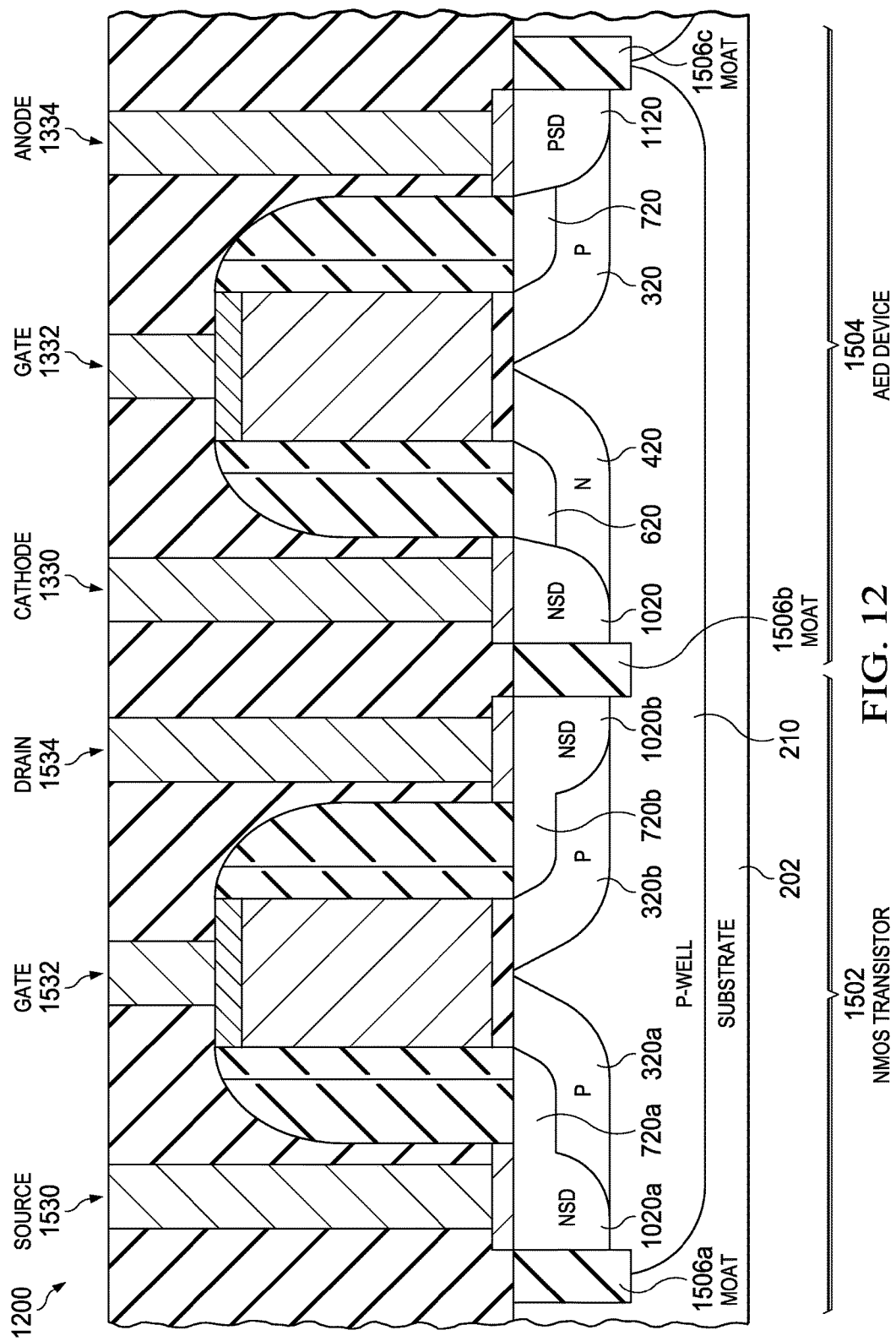
FIG. 12 illustrates in a cross-sectional view an arrangement for an NMOS transistor and an AED device constructed adjacent to each other.

FIG. 12 illustrates in a cross-sectional view an arrangement 1200 including an NMOS transistor 1502 and an AED device 1504 constructed adjacent to each other in a region 1500 over substrate 1502. The devices in FIG. 12 can be built concurrently within the same MOS fabrication process. The substrate 1502 contains a P-well region 210 which spans a pair of regions electrically isolated by STI 1506a, 1506b, 1506c. Within the P-well, between the center and left two isolation trenches 1506a and 1506b are NSD regions 1020a and 1020b, N-type regions 720a and 720b, P-type region 320a and 320b. Above the substrate 1602 in the NMOS region 1502 is the source contact 1530, gate contact 1532 and drain contact 1534 of an NMOS transistor. In the AED device region 1504, Nsd region 1020, the PLDD region 6020, N-type pocket region 420, P-type pocket region 320, NLDD region 720 and Psd region 1120 form the AED device. Above the substrate 1602 in the AED device region 1504 is the cathode contact 1330, the gate contact 1332 and the anode contact 1334 for the AED.

Illustrating the ability to create the AED device 1504 concurrently within a CMOS process along with the creation of an NMOS transistor, the P-well 210 for the NMOS transistor 1502 and AED device 1504 is formed in the same process step. The P-type regions 320a, 320b and 320 are all formed concurrently. The N-type area 420 is formed concurrently with similar regions (not shown in FIG. 12) during PMOS transistor construction. The NLDD regions 720a, 720b in the NMOS region as well as region 720 in the AED device region are formed concurrently. The PLDD region 620 is formed concurrently with similar regions (not shown) during PMOS transistor construction. The creation of the NSD regions 1020a, 1020b in the NMOS area 1520 and the NSD region 1020 in the AED area 1504 are formed concurrently. The PSD region 1120 is formed concurrently with similar regions (not shown) during PMOS transistor construction. Each of the structure types above the substrate 202 can be formed concurrently for the NMOS, PMOS and AED devices. It can be seen that by changing the conductivity types in portions of the pocket implants, and for the lightly doped drain and source/drain regions, a process for forming CMOS transistors can be used to form the novel AED device using existing implant materials and processes, so that the AED device is compatible with current semiconductor processes and tools, making fabrication of the AED devices cost effective and efficient.

Figure 13:
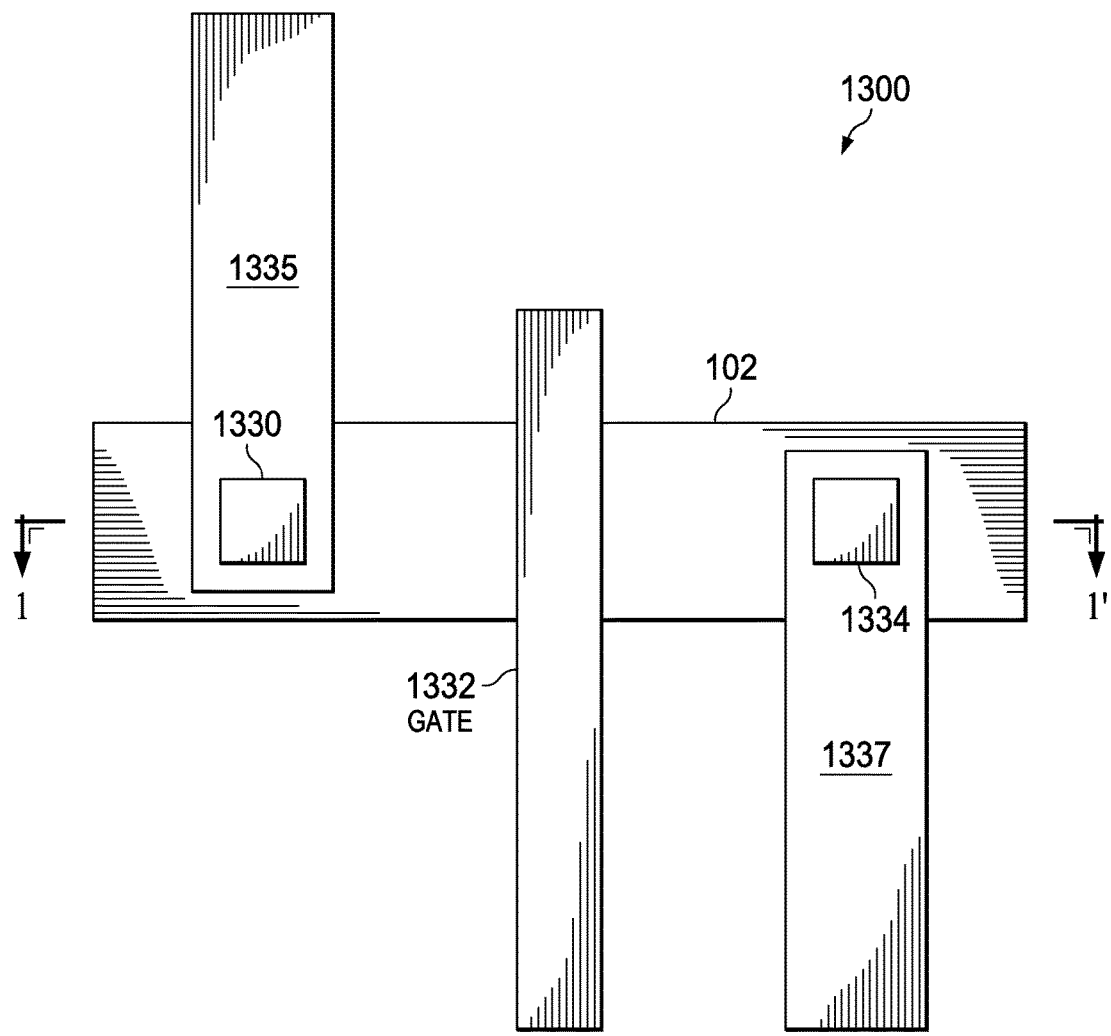
FIG. 13 is a top view of a layout portion of metal conductors coupled to an AED device of the arrangements.

FIG. 13 depicts in a top view a layout arrangement 1300 for connecting an AED such as, for example, AED 100 shown in a cross-section in FIG. 1, to conductors for use in coupling the device in a circuit. In FIG. 13 the cathode conductor 1335 is a metal portion arranged above and coupled to the AED device by a contact to the cathode contact as described above. A polysilicon or metal gate conductor 1332 is shown forming the gate for the AED and extending beyond and can be shared among commonly connected devices elsewhere on the substrate. An anode conductor 1337 is shown coupled to the AED device and is coupled by a contact to the metal silicide on the anode of the AED as shown in FIGS. 1 and 11, for example. An active area 102 corresponds to the active portion of the substrate containing the AED device such as the P-well in FIG. 1, for example.

Figure 14:
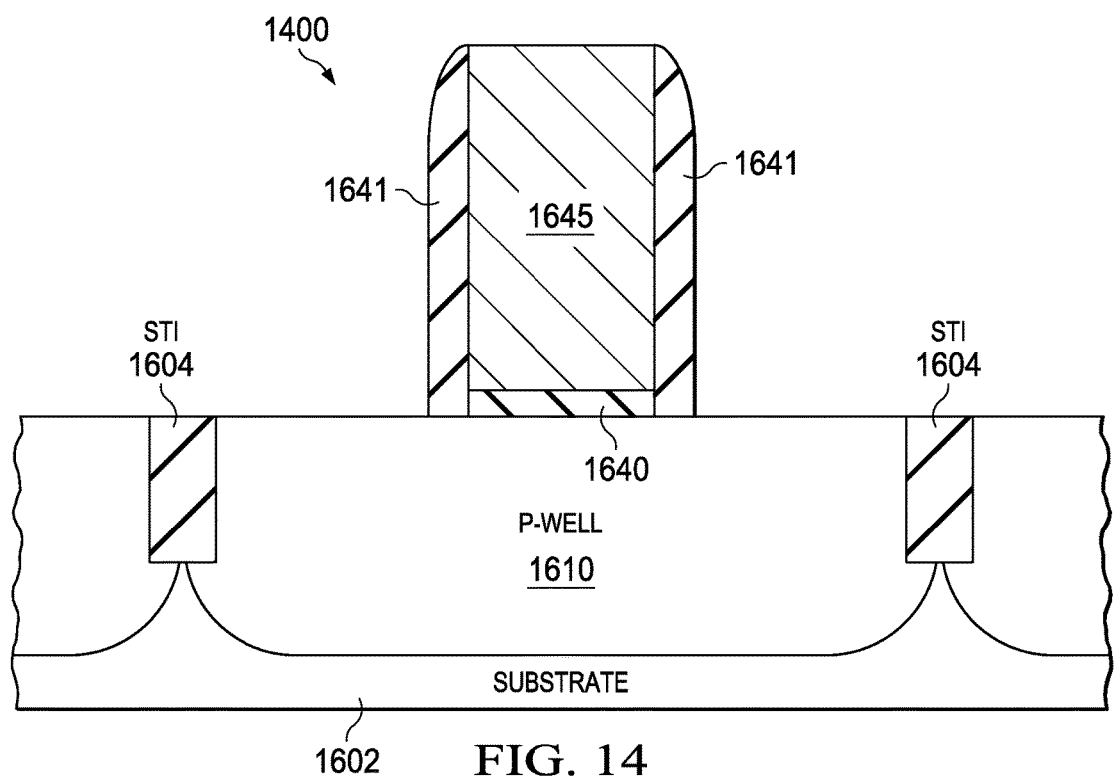
FIG. 14 depicts the first in a series of cross-sectional views depicting the successive steps for fabrication of an alternative arrangement for forming an AED using a self-aligned process.

FIG. 14 depicts the first in a series of steps shown in cross-sectional views depicting the successive construction of an artificial exciton device AED 1400 within a CMOS semiconductor process, using an alternative set of process steps that form an additional aspect of the present application. In this alternative arrangement, a self-aligning fabrication technique is used. Similar to the series of construction steps shown beginning at FIG. 2, a semiconductor substrate 1602 has STI isolation regions formed using an STI process to etch trenches 1604 from, for example, 200 to 500 nm deep from the surface of the substrate 1602 and filled with an insulator. LOCOS isolation can be used as an alternative isolation approach. Subsequently, a photoresist patterned for the p-type wells can be added to the surface of the substrate 1602, leaving exposed areas to be doped as a p-wells 1610, commonly extending from 50 to 500 nm below the bottom of the moats 1604. Still referring to FIG. 14, an AED gate dielectric layer 1640, typically of silicon dioxide or other insulating materials between 1 nm and 30 nm thick is formed on top of the p-well region 1610 by known methods. NMOS gate insulators and PMOS gate insulators (not visible in FIG. 14) commonly of the same materials and thicknesses can be formed concurrently with the AED gate insulator. The AED gate structure 1645 is formed on top of the AED gate dielectric 1640. The AED gate structure 1645 can be formed from polysilicon. Replacement gate technology to form a metal gate can also be used. As with the gate insulators, gates for NMOS and PMOS transistors being concurrently formed on the substrate 1602 (not visible in FIG. 14) may be formed concurrently with the formation of the AED gate. A gate photoresist is deposited (not illustrated for clarity) and the photoresist and patterned and is applied over the gate areas, and any unwanted polysilicon 1645 and gate dielectric 1640 are removed by known etching methods. Subsequently the gate photoresist is removed using known photoresist removal steps. Gate spacers 1641 are formed on the sides of the gate 1645 and the sides of the gate dielectric 1640. These are used to space implanted dopant ions from the channel region and also, to protect the gate dielectric 1640 from damage.

Figure 15:
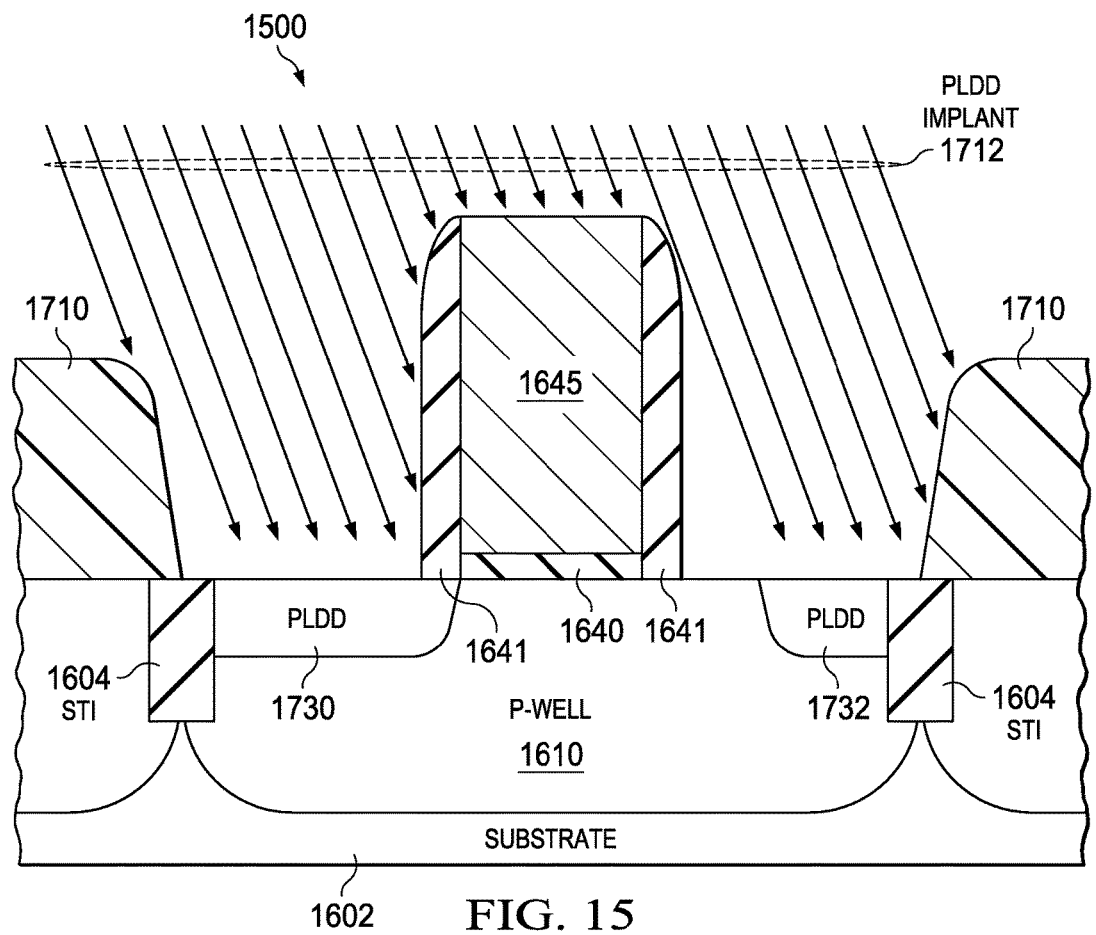
FIG. 15 depicts the next step in the series in a cross-sectional view of the construction of an AED device such as the one illustrated in FIG. 14 illustrating the self-aligned formation of PLDD regions.

FIG. 15 depicts in another step a cross-sectional view of AED 1500 construction illustrating the self-aligned formation of LDD regions. A photoresist 1710 for forming PLDD regions is applied to the substrate surface. The photoresist 1710 is then patterned leaving open regions to be implanted using an angled PLDD implant 1712. The angled nature of the PLDD implant utilizes the AED gate structure 1645 as a partial mask to form p-type regions 1730 and 1732 utilizing a self-aligning method. The new PLDD regions 1730 and 1732 are contained within the P-well region 1610, formed in a prior step. The shadow of the gate 1645 and gate spacers 1641 prevents the substrate area that is adjacent on one side of the gate (adjacent region 1732) from being implanted during the angled or tilt implant, as shown in FIG. 15.

Figure 16:
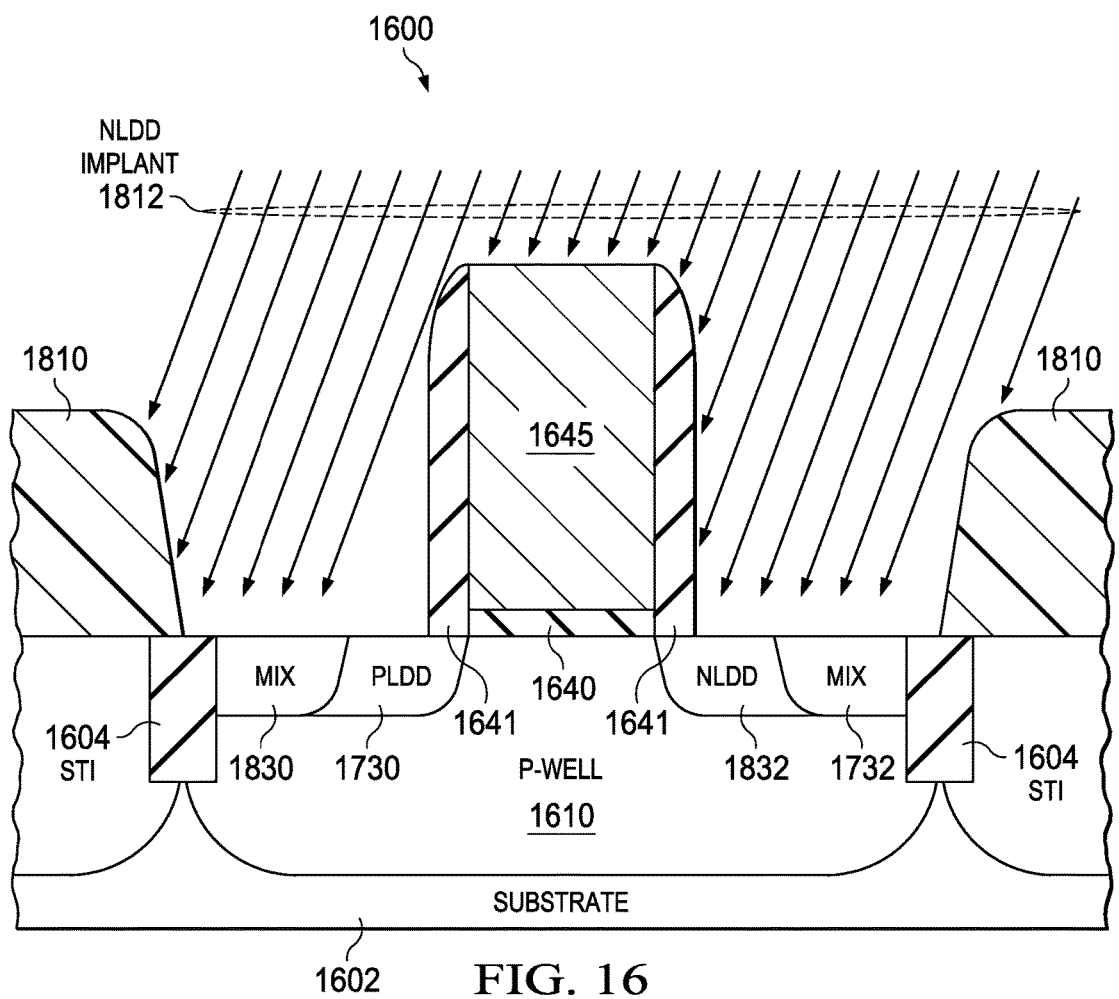
FIG. 16 depicts a next step in the series in a cross-sectional view of the construction of an AED device such as the one illustrated in FIG. 15, depicting the self-aligned formation of NLDD regions.

FIG. 16 depicts in a next step a cross-sectional view of construction of an AED 1600 illustrating the self-aligned formation of NLDD regions. A photoresist 1810 is applied to the substrate surface and patterned, leaving regions to be implanted using an angled n-type implant 1812. The angled nature of the implant utilizes the AED gate structure 1645 as a partial mask to form NLDD regions 1830 and 1832 utilizing a self-aligning method. The new doped regions 1830 and 1832 are contained within the P-well region 1610, formed in a prior step. Note that due to the use of the angled implant 1812, the shadow of gate 1645 and gate spacer 1641 prevents the NLDD implant from doping the region 1730, which remains P-type, while region 1830 receives the ions from the NLDD implant process.

Figure 17:
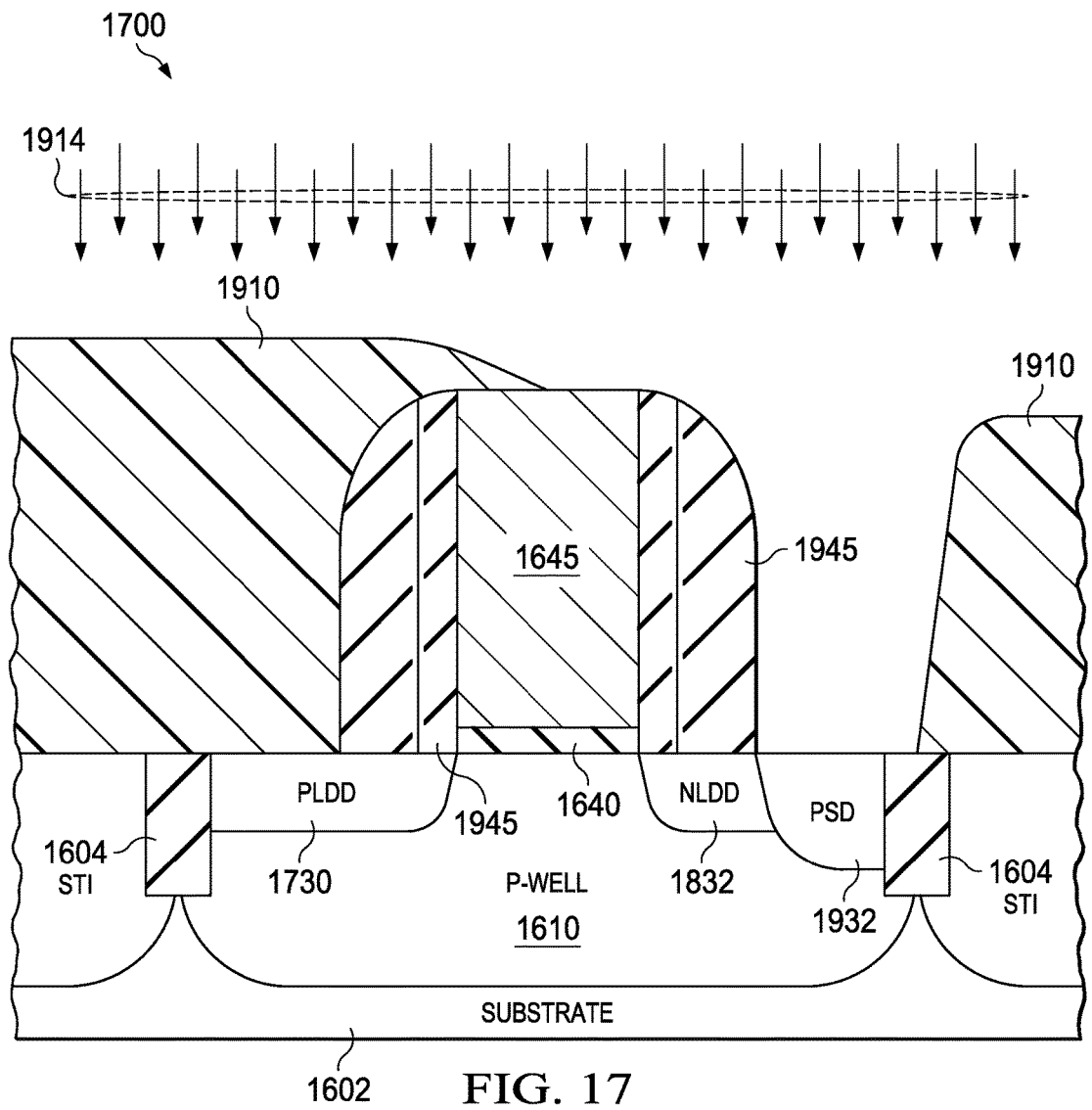
FIG. 17 depicts a next step in the series in a cross-sectional view of the construction of an AED device such as the one illustrated in FIG. 16, illustrating the formation of sidewalls and source/drain regions.

FIG. 17 depicts further steps in a cross-sectional view illustrating the construction of an AED 1700 illustrating creation of gate sidewall spacers and an ion implant step. AED gate offset spacers 1945 are formed on the lateral surfaces of the AED gate 1645, typically from a layer of silicon dioxide between 1 and 10 nm thick. The gate offset spacers 1945 can commonly be formed by oxidation of the polysilicon in the AED gate 1645, or by conformal deposits silicon dioxide and/or silicon nitride. The AED gate offset spacers 1945 can have a different thickness than NMOS or PMOS gate spacers on the substrate (not visible in FIG. 17). Also shown in FIG. 17 is the creation of the P-type source/drain region 1932. Photoresist 1910 is applied to the surface of the wafer leaving opening for implanting a region 1932 on the anode side of the AED. The P-type dopants, typically boron and possibly gallium or indium, are ion implanted into the top of the NLDD region 1832 and extending to a depth of from 25 to 250 nanometers at a total dose typically between $1 \times 10^{14}$ to $5 \times 10^{16}$ atoms/cm$^2$. The photoresist 1910 is then removed with known processes.

Figure 18:
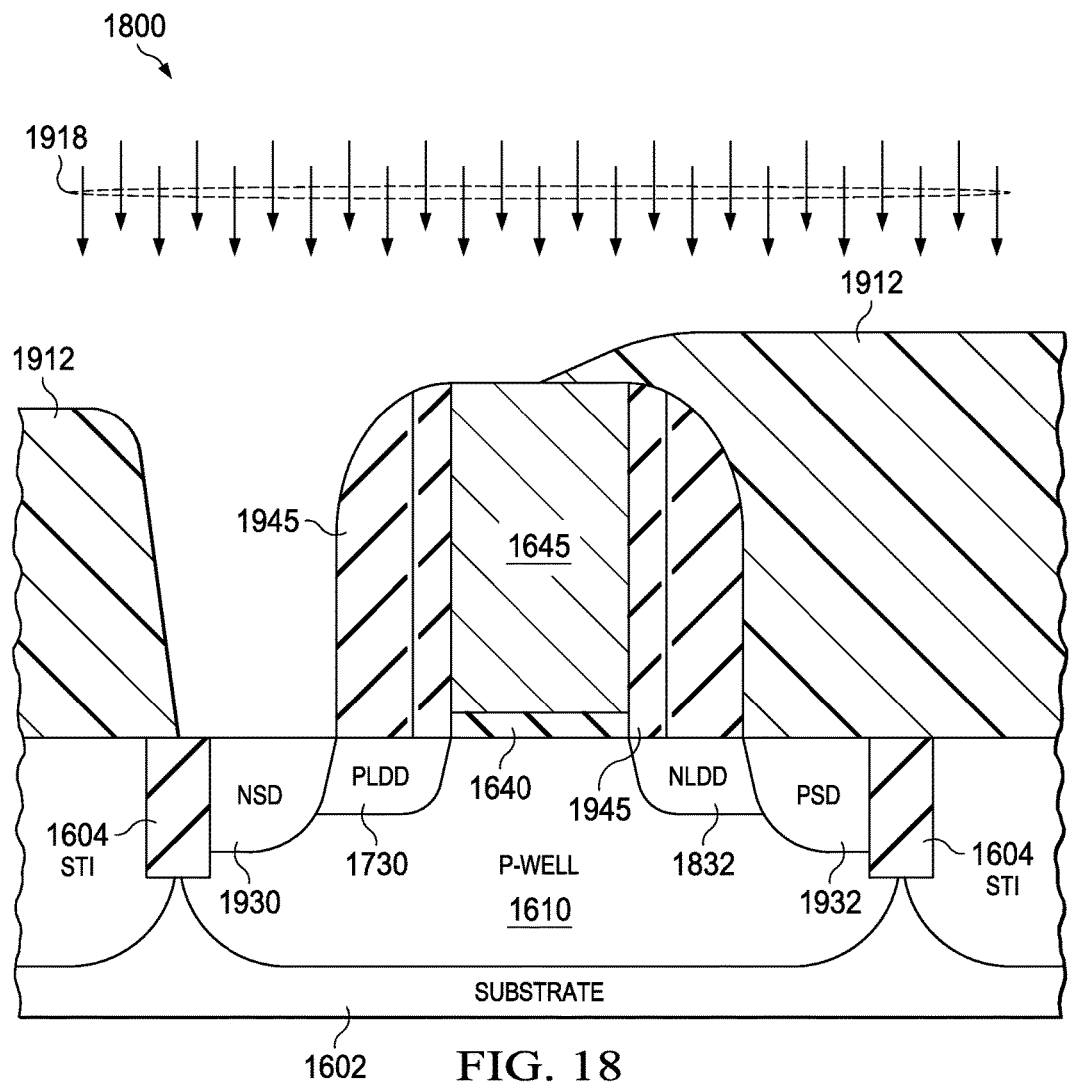
FIG. 18 depicts in another cross sectional view of the construction of an AED device such as the one illustrated in FIG. 17, illustrating the formation of additional source/drain regions.

FIG. 18 depicts further steps in a cross-sectional view in the construction of an AED 1800 illustrating another ion implantation step. In FIG. 18, a photoresist layer 1912 is deposited and patterned, leaving openings for forming N source/drain regions by an ion implantation 1918. The impurities in the N-type implant 1918 can be phosphorus and arsenic in concentration ranges of $1 \times 10^{14}$ to $5 \times 10^{16}$ atoms/cm$^2$. After the implanting step, the photoresist 1912 is removed with known processes. Both the P-type implantation and the N-type implantation shown in FIGS. 17 and 18 can also be used in forming source/drain regions of PMOS and NMOS transistors elsewhere on the substrate 202.

Figure 19:
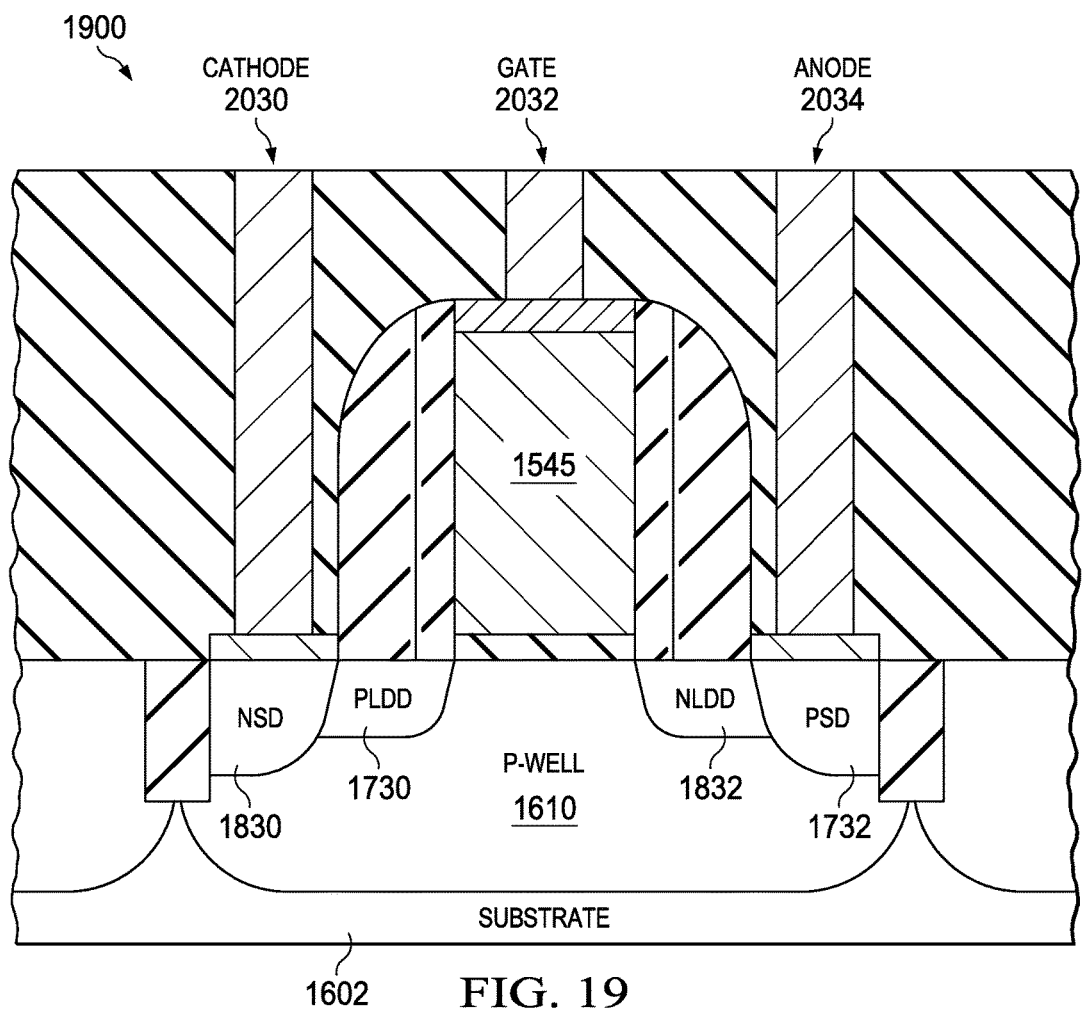
FIG. 19 depicts in another cross-sectional view a completed AED device such as the one illustrated in FIG. 18.

FIG. 19 depicts in another cross-sectional view a completed AED 1900 built concurrently within a CMOS semiconductor fabrication process, depicting the self-aligned formation of LDD regions. The metallization and dielectrics of the AED 1900 are completed in a similar fashion to the top portions of the AED device when formed with fine lithography tools as described above with respect to FIGS. 11 and 12 above. The position of the cathode contact 2030, gate contact 2032 and anode contact 2034 of AED 1900 remains consistent with FIG. 11. The metal conductor connections shown in FIG. 13 are also compatible with this alternative arrangement, that is, the AED formed using this alternative fabrication arrangement can be substituted for the AED formed using the previous arrangement.

Figure 20:
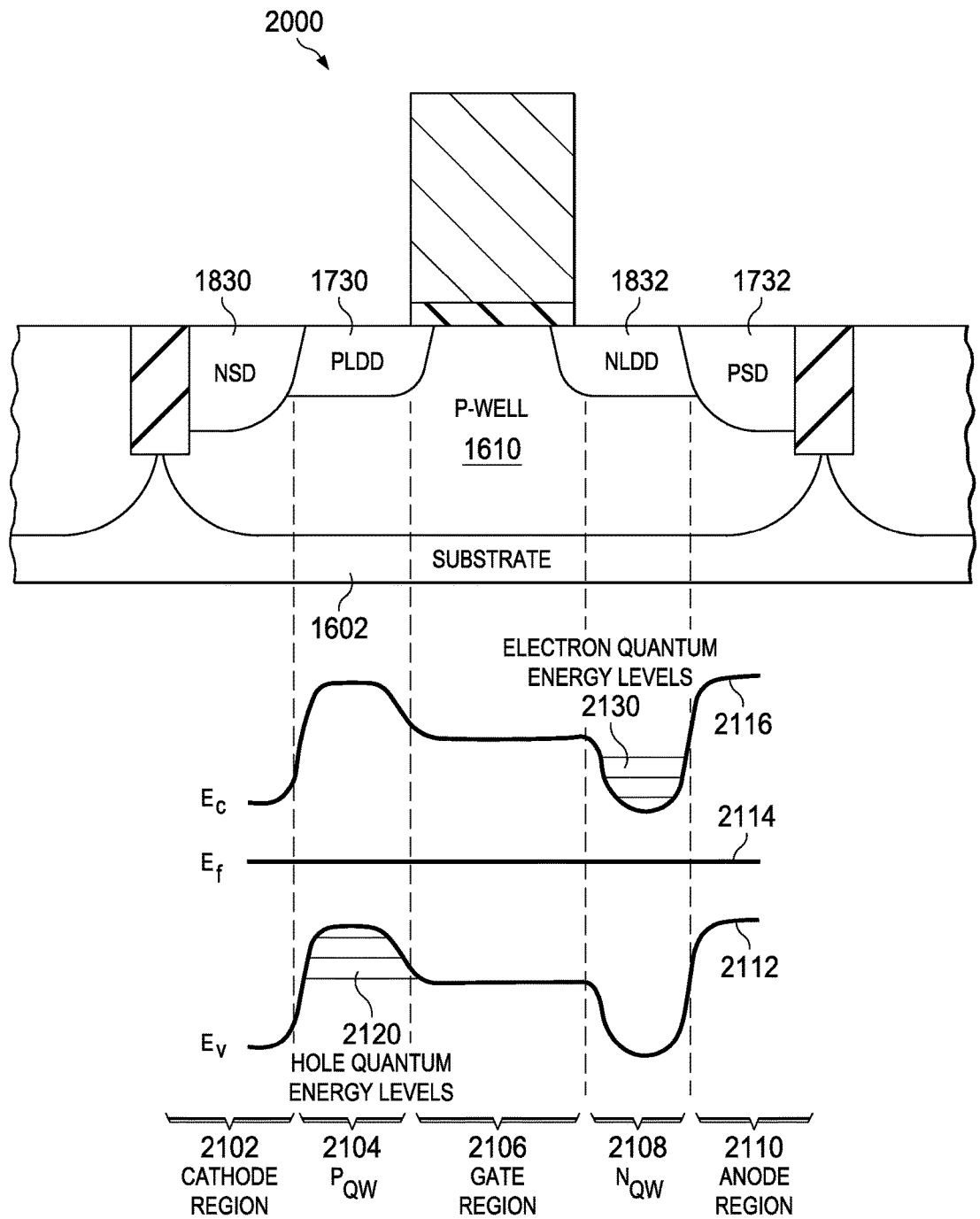
FIG. 20 depicts in a cross sectional view of a self-aligned AED device such as the one in FIG. 19 and the associated spatial energy band diagram.

FIG. 20 depicts in another cross-sectional view a self-aligned AED device 2000 and the associated spatial energy band diagram. The operation of the AED 2000 fabricated in the alternative approach remains the same as for the AED devices described formed in the previous arrangement shown above. The spatial energy band diagram plots a conduction band ($E_C$) 2116, a valance band ($E_V$) 2112 and the Fermi level ($E_F$) 2114 that correspond to the regions in the AED device 2000; the N-type cathode region 2102, p-type quantum well ($P_Qw$) 2104, channel region under the gate 2106, the n-type quantum well ($N_Qw$) 2108 and the P-type anode region 2110. In the formation of the $P_Qw$ and $N_Qw$ quantum well regions, the process depicted above will result in those regions spanning 10 nm to 20 nm, and preferably less than 15 nm in width as described above.

Following the energy band diagrams in FIG. 20 left-to-right through the AED areas, the cathode region 2102 is N-type which results in the Fermi level ($E_F$) 2114 being a few meV lower than the conduction band ($E_C$) 2116 at the left edge of the spatial energy band diagram. Within the $P_Qw$ 2104, a dopant level results in the elevation of the conduction band $E_c$ edge 2116. Moving to the right out of the $P_Qw$ region into the gate region 2106, the conduction band $E_c$ falls from the peak in the $P_Qw$ region back towards the Fermi level $E_F$ forming a hole quantum well $P_Qw$ 2014.

The conduction band $E_C$ remains at a fairly constant level moving to the right through the gate region 2106 until reaching the $N_Qw$ region 2108, the conduction band $E_c$ then falls closer to the Fermi level $E_F$ again and maintains that energy level moving from left to right thru the $N_Qw$ region 2108. As the conduction band $E_C$ passes into the P-type anode region 2110, the conduction band $E_C$ rises rapidly completing the quantum well region $N_Qw$ which contains electrons. Those familiar with the Heisenberg uncertainty principle, shown in Equation 2, will recognize that electrons within the well region 2108 exist in quantized energy levels depicted by 2130 and that as the quantum well region 2108 decreases in width, the gap in the quantized energy levels 2130 increases. Similarly, the quantum well created in the $P_QW$ region 2104 will contain holes in discrete energy levels as depicted in the valance band ($E_V$) 2112. As the $P_QW$ region 2104 is reduced in width, the gap in the energy levels 2120 will increase. Basic operation of this AED device is similar to the operation of the prior device and is described in Table 1.

Various modifications can also be made in the order of steps and in the number of steps to form additional novel arrangements that incorporate aspects of the present application, and these modifications will form additional alternative arrangements that are contemplated by the inventors as part of the present application and which fall within the scope of the appended claims.

Although the example illustrative arrangements have been described in detail, it should be understood that various changes, substitutions and alterations can be made herein without departing from the spirit and scope of the present application as defined by the appended claims.

Moreover, the scope of the present application is not intended to be limited to the particular illustrative example arrangement of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

What is claimed is:

1. A device, comprising:
   a semiconductor substrate having a surface;
   a well region in the semiconductor substrate and having a first conductivity type between a first end and a second end;
   a first doped region in the well region near the first end, the first doped region having a second conductivity type opposite the first conductivity type;
   a second doped region extending from the surface and abutting the first doped region, the second doped region shallower than the first doped region, and having the first conductivity type;
   a third doped region in the well region near the second end, the third doped region having the first conductivity type; and
   a fourth doped drain region extending from the surface and abutting the third doped region, the fourth doped region shallower than the third doped region, and having the second conductivity type.

2. The device of claim 1, wherein the first conductivity type is P-type and the second conductivity type is N-type.

3. The device of claim 1, wherein the first conductivity type is N-type and the second conductivity type is P-type.

4. The device of claim 1, further comprising:
   a fifth doped region directly under the second doped region and abutting the first doped region, the fifth doped region having the second conductivity type.

5. The device of claim 1, further comprising:
   a sixth doped region directly under the fourth doped region and abutting the third doped region, the sixth doped region having the first conductivity type.

6. The device of claim 1, further comprising:
   a channel region separating the second doped region and the fourth doped region;
   a first quantum well in the second doped region and positioned between the first doped region and the channel region;
   a second quantum well in the fourth doped region and positioned between the third doped region and the channel region; and
   a gate structure above the surface and between the first quantum well and the second quantum well.

7. The device of claim 6, wherein the first quantum well is a P quantum well, and the second quantum well is an N quantum well.

8. The device of claim 7, wherein the P quantum well and the N quantum well each have a width of between 10 and 20 nanometers.

9. The device of claim 7, wherein the P quantum well and the N quantum well each have a width of about 15 nanometers.

10. An integrated circuit, comprising:
    a semiconductor substrate having a surface;
    a well region in the semiconductor substrate and having a first conductivity type between a first end and a second end;
    an isolation structure extending from the surface and positioned between the first end and the second end of the well region;
    a device including:
       a first doped region in the well region near the second end, the first doped region having a second conductivity type opposite the first conductivity type;
       a second doped region extending from the surface and abutting the first doped region, the second doped region shallower than the first doped region, and having the first conductivity type;
       a third doped region in the well region near the isolation structure, the third doped region having the first conductivity type; and
       a fourth doped drain region extending from the surface and abutting the third doped region, the fourth doped region shallower than the third doped region, and having the second conductivity type; and
    a MOS transistor including:
       a first terminal region in the well region and near the first end; and
       a second terminal region in the well region and near the isolation structure.

11. The integrated circuit of claim 10, wherein the first conductivity type is P-type, and the second conductivity type is N-type.

12. The integrated circuit of claim 10, wherein the device includes:
    a fifth doped region directly under the second doped region and abutting the first doped region, the fifth doped region having the second conductivity type; and
    a sixth doped region directly under the fourth doped region and abutting the third doped region, the sixth doped region having the first conductivity type.

13. The integrated circuit of claim 10, wherein the device includes:
    a cathode electrode coupled to the first doped region; and
    an anode electrode coupled to the third doped region.

14. The integrated circuit of claim 10, wherein the device includes:
    a channel region separating the second doped region and the fourth doped region;
    a first quantum well in the second doped region and positioned between the first doped region and the channel region;
    a second quantum well in the fourth doped region and positioned between the third doped region and the channel region; and
    a gate structure above the surface and between the first quantum well and the second quantum well.

15. The integrated circuit of claim 14, wherein the first quantum well is a P quantum well, and the second quantum well is an N quantum well.

16. The integrated circuit of claim 10, wherein the MOS transistor includes an NMOS transistor.

17. The integrated circuit of claim 10, wherein the MOS transistor includes a PMOS transistor.

* * * * *